US006479198B2

(12) United States Patent
Makino et al.

(10) Patent No.: US 6,479,198 B2
(45) Date of Patent: Nov. 12, 2002

(54) SILVER HALIDE LIGHT-SENSITIVE MATERIAL CONTAINING TANNING DEVELOPING AGENT

(75) Inventors: Naonori Makino, Shizuoka (JP); Kaku Sakata, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/774,589

(22) Filed: Feb. 1, 2001

(65) Prior Publication Data

US 2001/0051314 A1 Dec. 13, 2001

(30) Foreign Application Priority Data

Feb. 1, 2000 (JP) ....................................... 2000-024437
Feb. 1, 2000 (JP) ....................................... 2000-024438
Apr. 26, 2000 (JP) ....................................... 2000-125204
Jun. 19, 2000 (JP) ....................................... 2000-183174

(51) Int. Cl.[7] ........................... G03C 1/42; G03C 5/30; G03F 7/06; G03F 7/32

(52) U.S. Cl. ......................... 430/17; 430/264; 430/265; 430/266; 430/268; 430/437; 430/438; 430/441; 430/444; 430/478; 430/485; 430/566

(58) Field of Search ................................ 430/264, 265, 430/266, 268, 218, 437, 438, 441, 444, 478, 485, 566

(56) References Cited

U.S. PATENT DOCUMENTS 2,710,801 A * 6/1955 Minsk et al. ............... 430/551
2,735,765 A * 2/1956 Loria et al. ................. 430/551
2,751,295 A * 6/1956 Salimen et al. ............. 430/264
2,856,283 A * 10/1958 Yackel et al. ............... 430/264
2,949,359 A * 8/1960 Blout et al. ................. 430/441
3,022,166 A * 2/1962 Green et al. ................ 430/441
3,022,167 A * 2/1962 Green ........................ 430/441
3,142,564 A * 7/1964 Blout et al. ................. 430/441
3,707,370 A * 12/1972 Rasmussen et al. ........ 430/218
3,972,719 A * 8/1976 Vanreusel et al. .......... 430/266
4,221,858 A * 9/1980 Shiba et al. ................ 430/266
4,283,478 A 8/1981 Kubotera et al. ........... 430/156
4,283,479 A 8/1981 Hamaoka et al. ........... 430/264
4,299,909 A 11/1981 Imatomi et al. ............ 430/264
4,481,286 A * 11/1984 King et al. ................. 430/218
5,026,634 A * 6/1991 Ono et al. .................. 430/216
5,427,891 A 6/1995 Hirano et al. ............... 430/438
5,609,987 A 3/1997 Kitteridge et al. .......... 430/265
5,800,974 A 9/1998 Wallis et al. ............... 430/444

FOREIGN PATENT DOCUMENTS

| | | | |
|---|---|---|---|
| GB | 1 590 058 | 5/1981 | ............. G03F/7/06 |
| JP | 54-49202 | 4/1979 | ............. G03F/7/06 |
| JP | 55-126250 | 9/1980 | ............. G03F/7/02 |
| JP | 56-106420 | 8/1981 | ............ H03K/5/13 |
| JP | 4-324866 | 11/1992 | ............. G03F/7/06 |

* cited by examiner

*Primary Examiner*—Richard L. Schilling
(74) *Attorney, Agent, or Firm*—Sughrue Mion, PLLC

(57) ABSTRACT

A silver halide light-sensitive material comprises a support and a silver halide gelatin emulsion layer. The silver halide gelatin emulsion layer or an optionally provided hydrophilic layer contains a tanning developing agent. According to the first embodiment of the present invention, the tanning developing agent has a molecular structure in which two to six benzenediol or benzenetriol rings are connected with a linking group. According to the second embodiment of the invention, the tanning developing agent consists of a polymer having side chains containing benzenediol or benzenetriol rings. According to the third embodiment of the invention, the tanning developing agent consists of a benzenediol or benzenetriol ring having an aliphatic substituent group having 5 to 40 carbon atoms or an aromatic substituent group having 7 to 40 carbon atoms. A tanning developing solution and a lithographic printing plate are also disclosed.

9 Claims, 8 Drawing Sheets

SILVER HALIDE LIGHT-SENSITIVE MATERIAL CONTAINING TANNING DEVELOPING AGENT

FIELD OF THE INVENTION

The present invention relates to a silver halide light-sensitive material containing a tanning developing agent. The invention also relates to a tanning developing solution and a lithographic printing plate.

BACKGROUND OF THE INVENTION

Tanning development has been well known in the field of a silver halide photography. For example, T. H. James, The Theory of the Photographic Process, 4th edition, pages 326 to 327 describes the tanning development in detail. When a silver halide light-sensitive material is developed with a phenol type developing agent, such as pyrogallol, hydroquinone or catechol, gelatin of a silver halide emulsion layer is hardened within an exposed area of the emulsion. This phenomenon is referred to as a tanning effect, which is caused by an oxidation product of the phenol type developing agent.

Tanning effect gives soft gradation to a silver halide photographic image. Since the hardened gelatin within the exposed area prevents a developing solution from further penetrating into a silver halide emulsion layer, the development is inhibited within the exposed area.

The tanning effect can also be used to form a relief image. After gelatin is hardened within the exposed area, unhardened gelatin in the unexposed area can be removed form the layer to form a relief image of hardened gelatin.

The relief image of hardened gelatin can be used as a lithographic printing plate. If the relief image of hardened gelatin is formed on a hydrophilic support (such as an aluminum plate), the area of the support surface (where unhardened gelatin was removed) works as hydrophilic area. On the other hand, the area where the relief is formed works as oleophilic area. Dampening water is attached on the hydrophilic area, and oily ink is attached on oleophilic area in the lithographic printing process.

Japanese Patent Provisional Publication Nos. 53(1978)-135702, 54(1979)-49202, 54(1979)-152502, 55(1980)-126250, 4(1992)-324866 and 5(1993)-289228 describe a lithographic printing process using a relief image of hardened gelatin as a printing plate.

SUMMARY OF THE INVENTION

The lithographic printing plate of hardened gelatin relief image has an advantage that silver halide works as a highly sensitive photosensor. The lithographic printing plate has another advantage that the plates can be can be prepared by a simple process compared with other conventional printing plates.

When the relief image of hardened gelatin is used as a lithographic printing plate, the area of the support surface works as hydrophilic area, and the area where the relief is formed works as oleophilic area. Though the hardened gelatin is relatively oleophilic as compared with the support surface, the gelatin itself is not strongly oleophilic. Moreover, the hardened gelatin is often referred to as a hydrophilic substance. The hardened gelatin sometimes absorbs dampening water in the lithographic printing process. The hardened gelatin swells or is softened (or weakened) with the dampening water.

Poorly oleophilic hardened gelatin often causes a trouble of a poor affinity with ink when the relief image of hardened gelatin is used as a lithographic printing plate. Further, weak hardened gelatin often causes a trouble of poor printing durability.

Japanese Patent Publication Nos. 53(1978)-135702, 54(1979)-49202, 54(1979)-152502, 55(1980)-12625, 4(1992)-324866 and 5(1993)-289228 propose that the hardened gelatin be subjected to treatments (a heat treatment, a light irradiation treatment, a chemical treatment) after forming the relief image to improve the ink affinity and the printing durability. However, the post-treatments mar the advantage of a simple process. The heat treatment often lowers the adhesion between the hardened gelatin and the support. The light irradiation treatment needs a strong light-irradiating apparatus. The chemical substances used in the chemical treatment have toxicity and hardly give satisfying effects.

An object of the present invention is to form highly oleophilic and highly durable hardened gelatin by using a new tanning developing agent.

The first embodiment of the present invention provides a silver halide light-sensitive material comprising a support amd a silver halide gelatin emulsion layer, wherein the silver halide gelatin emulsion layer or an optionally provided hydrophilic layer contains a tanning developing agent having a molecular structure in which two to six benzenediol or benzenetriol rings are connected with a linking group.

The first embodiment also provides a tanning developing solution consisting of an aqueous alkali solution of a tanning developing agent having a molecular structure in which two to six benzenediol or benzenetriol rings are connected with a linking group.

The first embodiment further provides a process for preparation of a lithographic printing plate comprising the steps in order of: imagewise exposing to light a silver halide light-sensitive material comprising a hydrophilic support and a silver halide gelatin emulsion layer, subjecting the silver halide light-sensitive material to tanning development to harden gelatin within an exposed area by using a tanning developing agent having a molecular structure in which two to six benzenediol or benzenetriol rings are connected with a linking group; and removing unhardened gelatin within unexposed area from the silver halide gelatin emulsion layer to form a relief image of the hardened gelatin on the hydrophilic support.

The first embodiment furthermore provides a lithographic printing plate comprising a relief image of a hardened gelatin on a hydrophilic support, wherein the gelatin is hardened by an oxidation product of a tanning developing agent having a molecular structure in which two to six benzenediol or benzenetriol rings are connected with a linking group.

The second embodiment of the invention provides a silver halide light-sensitive material comprises a support and a silver halide gelatin emulsion layer, wherein the silver halide gelatin emulsion layer or an optionally provided hydrophilic layer contains a tanning developing agent consisting of a polymer having side chains containing benzenediol or benzenetriol rings.

The second embodiment also provides a tanning developing solution consisting of an aqueous alkali solution of a tanning developing agent consisting of a polymer having side chains containing benzenediol or benzenetriol rings The second embodiment further provides a process for preparation of a lithographic printing plate comprising the steps in order of: imagewise exposing to light a silver halide light-sensitive material comprising a support and a silver halide gelatin emulsion layer, subjecting the silver halide light-sensitive material to tanning development to harden gelatin within an exposed area by using a tanning developing agent consisting of a polymer having side chains containing benzenediol or benzenetriol rings; and removing unhardened gelatin within unexposed area from the silver halide gelatin emulsion layer to form a relief image of the hardened gelatin on the hydrophilic support.

The second embodiment furthermore provides a lithographic printing plate comprising a relief image of a hardened gelatin on a hydrophilic support, wherein the gelatin is hardened by an oxidation product of a tanning developing agent consisting of a polymer having side chains containing benzenediol or benzenetriol rings.

The third embodiment of the invention provides a process for preparation of a lithographic printing plate comprising the steps in order of: imagewise exposing to light a silver halide light-sensitive material comprising a support and a silver halide gelatin emulsion layer, subjecting the silver halide light-sensitive material to tanning development to harden gelatin within an exposed area by using a phenol compound represented by the formula (II); and removing unhardened gelatin within unexposed area from the silver halide gelatin emulsion layer to form a relief image of the hardened gelatin on the hydrophilic support:

(II)

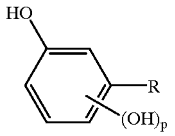

in which p is 1 or 2; and R is an aliphatic group having 5 to 40 carbon atoms, an aromatic group having 7 to 40 carbon atoms, an aliphatic acyl group having 5 to 40 carbon atoms, an aromatic acyl group having 7 to 40 carbon atoms, an aliphatic oxycarbonyl group having 5 to 40 carbon atoms, an aromatic oxycarbonyl group having 7 to 40 carbon atoms, an aliphatic acyloxy group having 5 to 40 carbon atoms, an aromatic acyloxy group having 7 to 40 carbon atoms, an aliphatic carbamoyl group having 5 to 40 carbon atoms or an aromatic carbamoyl group having 7 to 40 carbon atoms.

The third embodiment also provides a lithographic printing plate comprising a relief image of a hardened gelatin on a hydrophilic support, wherein the gelatin is hardened by a phenol compound represented by the formula (II).

The present inventors have searched and developed an improved tanning developing agent in place of adding a post-treatment proposed in the prior art references. As a result, the inventors have succeeded in preparing a highly oleophilic and highly durable hardened gelatin with a new tanning developing agent. The first embodiment of the present invention uses a compound having a molecular structure in which two to six benzenediol or benzenetriol rings are connected with a linking group. The second embodiment of the invention uses a polymer having side chains containing benzenediol or benzenetriol rings. The third embodiment uses a compound consisting of a benzenediol or benzenetriol ring having an aliphatic substituent group having 5 to 40 carbon atoms or an aromatic substituent group having 7 to 40 carbon atoms. The benzenediol or benzenetriol ring corresponds to a conventional tanning developing agent (e.g., pyrogallol, hydroquinone or catechol). The prepared hardened gelatin is oleophilic and durable enough to be used as a lithographic printing plate.

The lithographic printing plate of hardened gelatin relief image has an advantage that silver halide is used as a highly sensitive photosensor. The printing plate has another advantage that the plate can be prepared by a simple process.

DETAILED DESCRIPTION OF THE INVENTION

[Tanning developing agent (first embodiment)]

Figure 1:
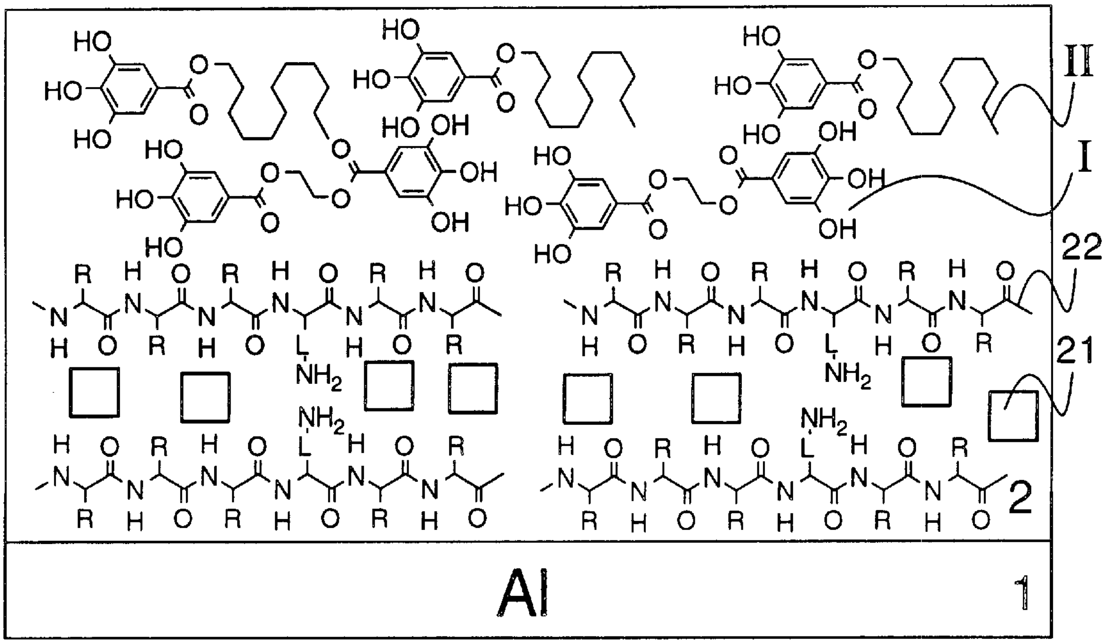
FIG. 1 is a sectional view schematically illustrating a silver halide light-sensitive material (according to a combination of the first and third embodiments).

A tanning developing agent used in the first embodiment of the present invention is a compound having a molecular structure in which two to six benzenediol or benzenetriol rings are connected with a linking group.

The benzenediol or benzenetriol rings are connected to the linking group preferably as monovalent groups (i.e., dihydroxyphenyl or trihydroxyphenyl, respectively). The benzenediol or benzenetriol rings are connected to the linking group more preferably as 3,4-dihydroxyphenyl or 3,4,5-trihydroxyphenyl, respectively.

The benzenediol or benzenetriol rings may have a substituent group (e.g., an alkyl group, an alkoxy group, an aralkyl group) other than hydroxyl. However, the benzenediol or benzenetriol rings preferably have no substituent group other than hydroxyl.

The compound has preferably two, three or four, more preferably two or three, and most preferably two benzenediol or benzenetriol rings.

The linking group is preferably a divalent to hexavalent group selected from the group consisting of a divalent to hexavalent aliphatic group, a divalent to hexavalent aromatic group, a divalent to hexavalent heterocyclic group, —O—, —S—, —CO—, —NH—, —N<, $—SO_2—$, —SO— and a combination thereof. The linking group is more preferably a divalent to tetravalent group selected from the group consisting of a divalent to tetravalent aliphatic group, a divalent to tetravalent aromatic group, a divalent to tetravalent heterocyclic group, —O—, —CO—, —NH—, —N<, $—SO_2—$ and a combination thereof. The linking group is further preferably a divalent to tetravalent combined group of at least two of a divalent to tetravalent aliphatic group, a divalent to tetravalent aromatic group, a divalent to tetravalent heterocyclic group, —O—, —CO—, —NH—, —N< and $—SO_2—$. The linking group is most preferably a divalent to tetravalent combined group of at least three of them.

A preferred tanning developing agent is represented by the formula (I).

(I)

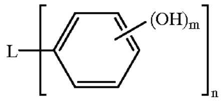

In the formula (I), L is a n-valent linking group selected from the group consisting of a divalent to hexavalent aliphatic group, a divalent to hexavalent aromatic group, a divalent to hexavalent heterocyclic group, —O—, —S—, —CO—, —NH—, —N<, $—SO_2—$, —SO— and a combination thereof. The aliphatic group, the aromatic group and the heterocyclic group can have substituent groups.

The aliphatic group has preferably 1 to 60, more preferably 1 to 30, further preferably 1 to 20, and most preferably 1 to 10 carbon atoms. The aliphatic group can be unsaturated (can have a double or triple bond). The go aliphatic group can have a cyclic or branched structure.

The aromatic group preferably comprises a benzene or naphthalene ring, and more preferably comprises a benzene ring.

The heterocyclic group preferably comprises a 3 to 10 membered heterocyclic ring, more preferably comprises a 4 to 8 membered heterocyclic ring, and most preferably comprises a 5 or 6 membered heterocyclic ring. The heterocyclic ring preferably has a nitrogen, oxygen or sulfur atom as a hetero-atom. The heterocyclic ring can be condensed with an aliphatic ring, an aromatic ring or another heterocyclic ring. The heterocyclic ring can also be spiro-united with an aliphatic ring or another heterocyclic ring. Examples of the heterocyclic rings include pyrrolidine ring, piperidine ring, piperazine ring, morpholine ring, tetrahydrofuran ring, tetrahydropyran ring, tetrahydrothiophene ring, dioxane ring, oxazole ring, thiazole ring, pyridine ring, pyrazine ring, triazine ring, furan ring, thiophene ring and isocyanuric ring.

Examples of the substituent groups of the aliphatic group, the aromatic group and the heterocyclic group include hydroxyl, a halogen atom (e.g., chlorine), cyano, amino, a substituted amino group, a heterocyclic group, an acyl group and an acyloxy group. The substituent group of the substituted amino group is preferably an alkyl group or an aryl group.

The aromatic group and the heterocyclic group can have an alkyl group as the substituent group.

L is preferably a divalent to tetravalent group selected from the group consisting of a divalent to tetravalent aliphatic group, a divalent to tetravalent aromatic group, a divalent to tetravalent heterocyclic group, —O—, —CO—, —NH—, —N<, $—SO_2—$ and a combination thereof. L is more preferably a divalent to tetravalent combined group of at least two of a divalent to tetravalent aliphatic group, a divalent to tetravalent aromatic group, a divalent to tetravalent heterocyclic group, —O—, —CO—, —NH—, —N< and $—SO_2—$. L is most preferably a divalent to tetravalent combined group of at least three of them.

Examples of the linking groups (L) include

L1

$—O—CH_2—O—$ ,

L2

$—O—CH_2—CH_2—O—$ ,

L3

$—O—CH_2—CH_2—CH_2—O—$ ,

-continued

L4

$—O—CH_2—CH_2—CH_2—CH_2—O—$ ,

L5

$—O—CH_2—CH_2—CH_2—CH_2—CH_2—O—$ ,

L6

$—O—CH_2—CH_2—CH_2—CH_2—CH_2—CH_2—O—$ ,

L7

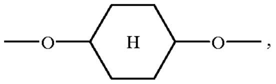

L8

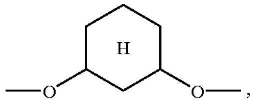

L9

$—CO—NH—CH_2—CH_2—NH—CO—$ ,

L10

$—CO—NH—CH_2—CH_2—CH_2—NH—CO—$ ,

L11

$—CO—NH—CH_2—CH_2—CH_2—CH_2—NH—CO—$ ,

L12

$—CO—NH—CH_2—CH_2—CH_2—CH_2—CH_2—NH—CO—$ ,

L13

$—CO—NH—CH_2—CH_2—CH_2—CH_2—CH_2—CH_2—NH—CO—$ ,

L14

$—CO—O—CH_2—O—CO—$ ,

L15

$—CO—O—CH_2—CH_2—O—CO—$ ,

L16

$—CO—O—CH_2—CH_2—CH_2—O—CO—$ ,

L17

$—CO—O—CH_2—CH_2—CH_2—CH_2—O—CO—$ ,

L18

$—CO—O—CH_2—CH_2—CH_2—CH_2—CH_2—O—CO—$ ,

L19

$—CO—O—CH_2—CH_2—CH_2—CH_2—CH_2—CH_2—O—CO—$ ,

L20

$—CO—O—CH_2—CH_2—O—CH_2—CH_2—O—CO—$ ,

L21

$—CO—O—CH_2—CH_2—NH—CH_2—CH_2—O—CO—$ ,

L22

$—CO—NH—CH_2—CH_2—O—CH_2—CH_2—NH—CO—$ ,

L23

$—CO—NH—CH_2—CH_2—NH—CH_2—CH_2—NH—CO—$ ,

L24

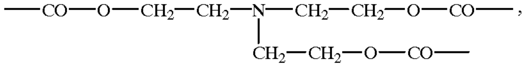

L25

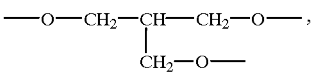

L26

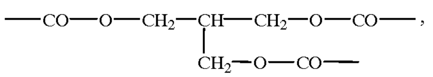

-continued

L27

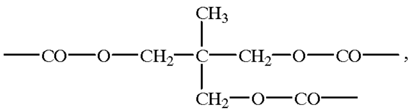

L28

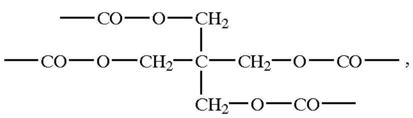

L29

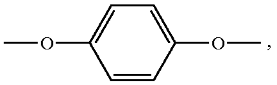

L30

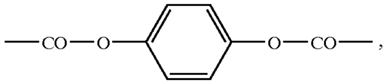

L31

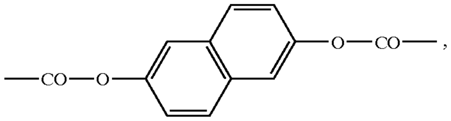

L32

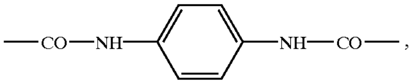

L33

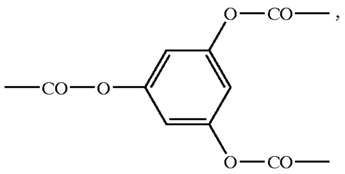

L34

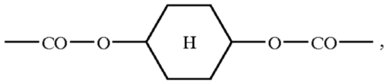

L35

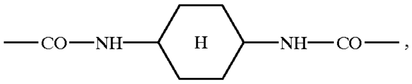

L36

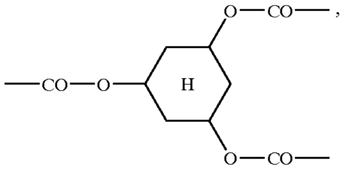

L37

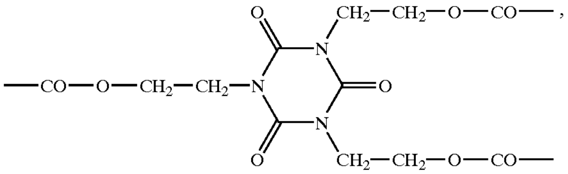

-continued

L38

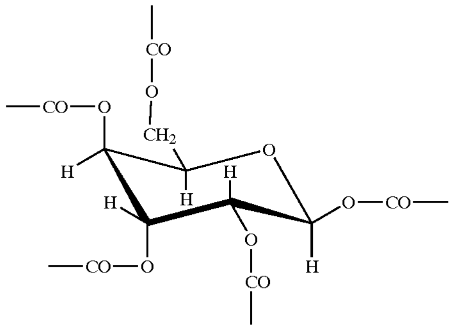

L39

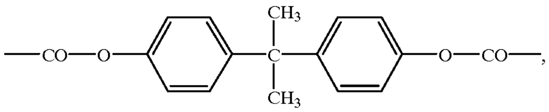

L40

$—SO_2—NH—CH_2—CH_2—CH_2—NH—SO_2—$,

L41

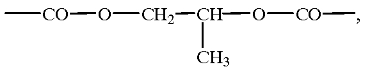

L42

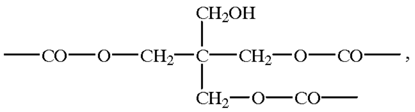

L43

$—CO—CH_2—CH_2—CO—$,

L44

$—CO—CH_2—CH_2—CH_2—CO—$,

L45

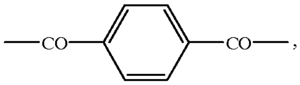

L46

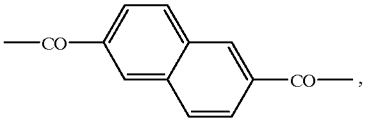

L47

$—NH—CO—CH_2—CH_2—CO—NH—$,

L48

$—NH—CO—CH_2—CH_2—CH_2—CO—NH—$ and

L49

$—NH—SO_2—CH_2—CH_2—CH_2—SO_2—NH—$.

In the formula (I), the benzene ring may have a substituent group (e.g., an alkyl group, an alkoxy group, an aralkyl group) other than hydroxyl. However, the benzene ring preferably has no substituent group other than hydroxyl.

In the formula (I), m is 2 or 3.

In the formula (I), n is an integer of 2 to 6, preferably is an integer of 2 to 4, more preferably is 2 or 3, and most preferably is 2.

Examples of the tanning developing agents represented by the formula (I) are shown below.

(I-1)
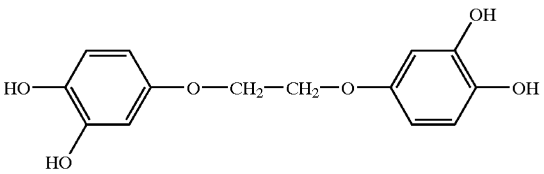
(I-2)
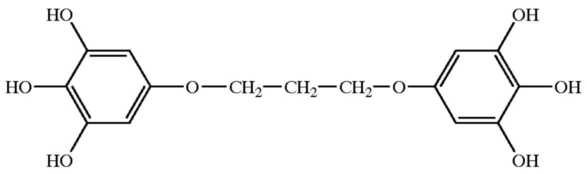
(I-3)
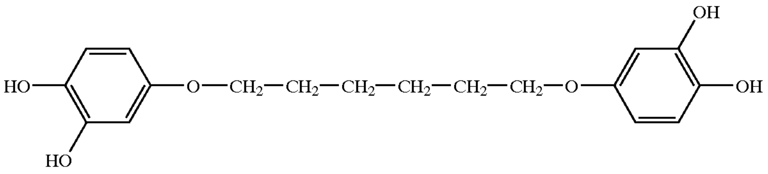
(I-4)
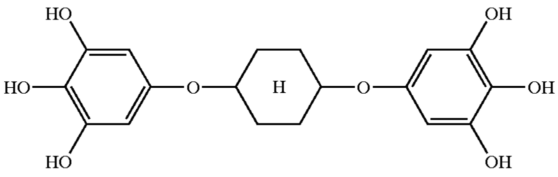
(I-5)
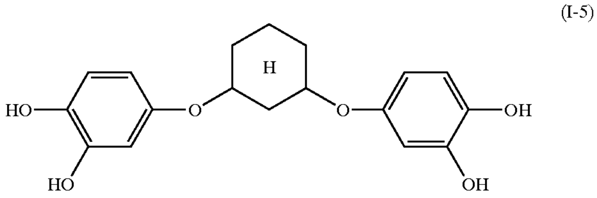
(I-6)
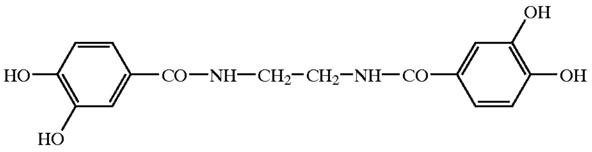
(I-7)
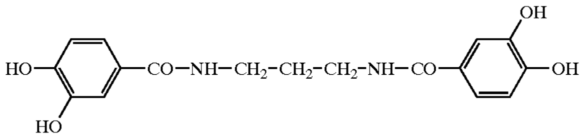
(I-8)
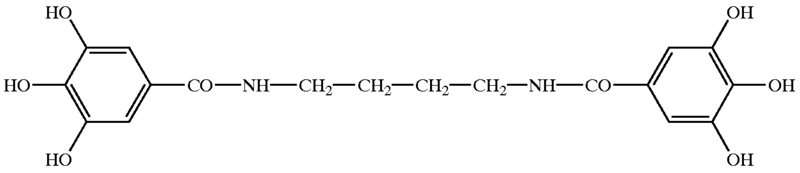
(I-9)
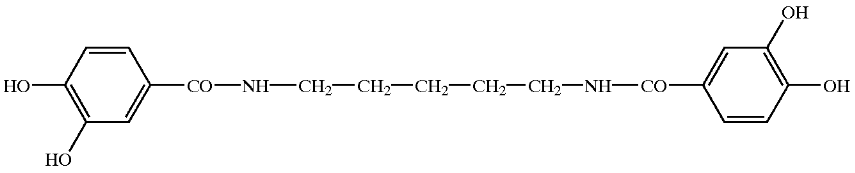
(I-10)
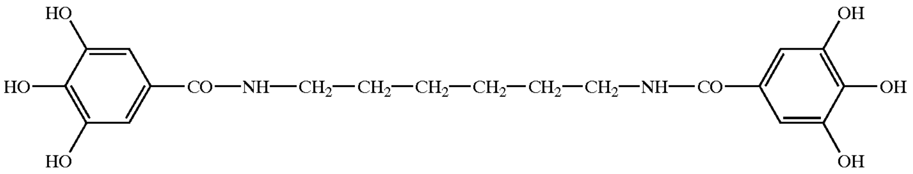
(I-11)
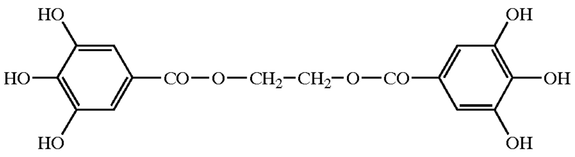
(I-12)
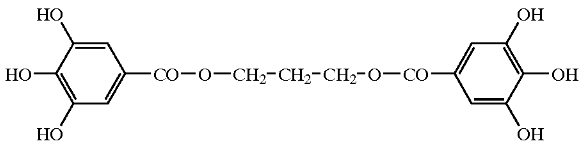

-continued
(I-13)
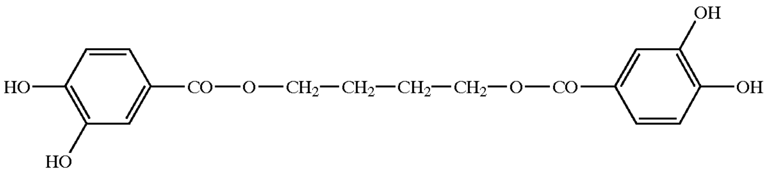
(I-14)
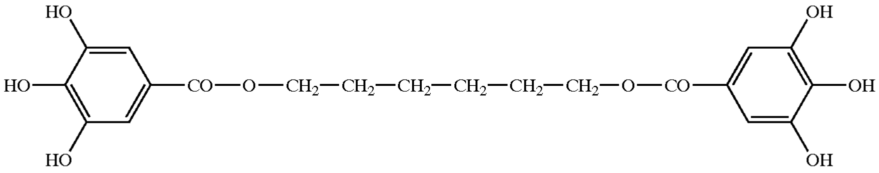
(I-15)
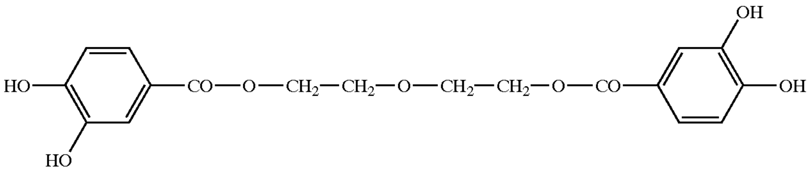
(I-16)
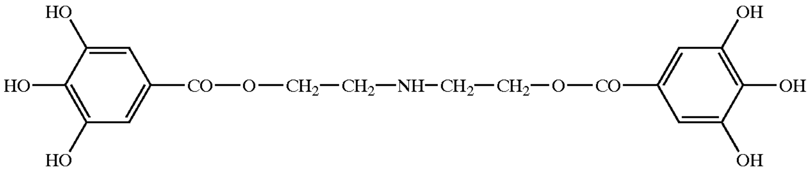
(I-17)
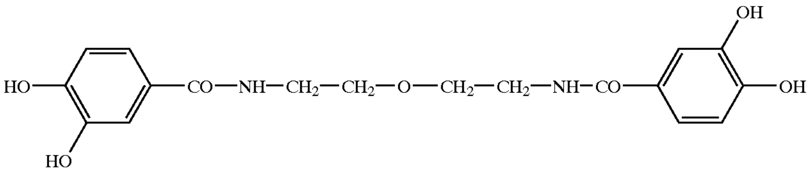
(I-18)
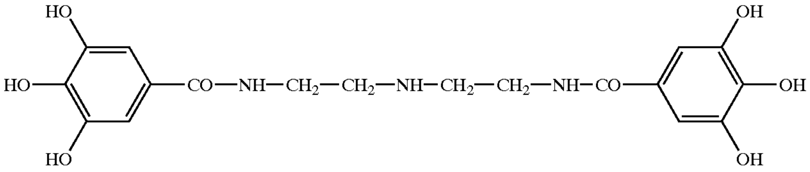
(I-19)
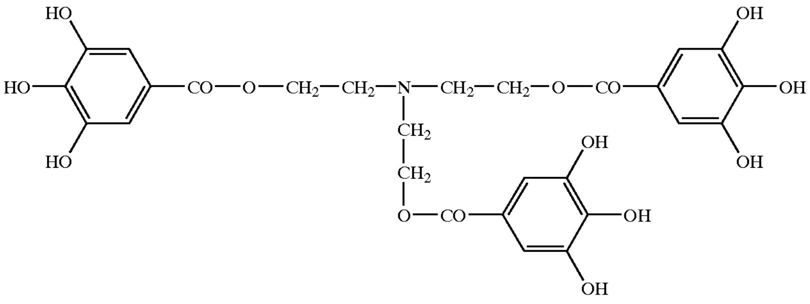

-continued
(I-20)
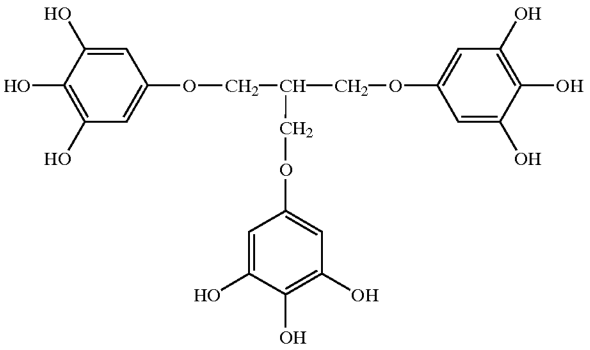
(I-21)
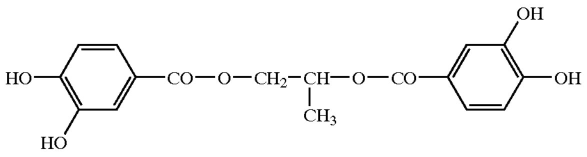
(I-22)
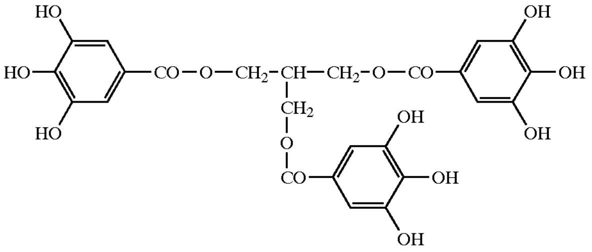
(I-23)
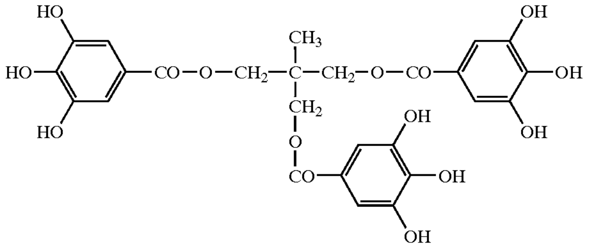
(I-24)
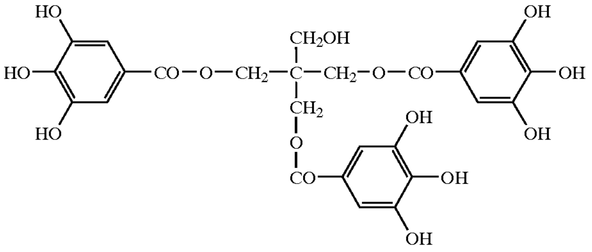
(I-25)
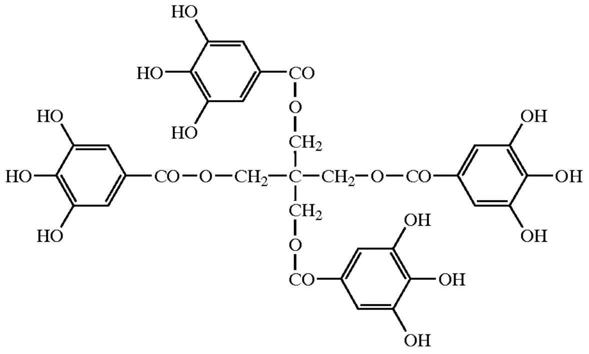
(I-26)
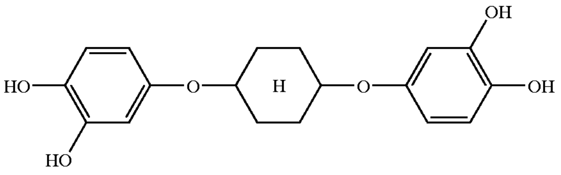
(I-27)
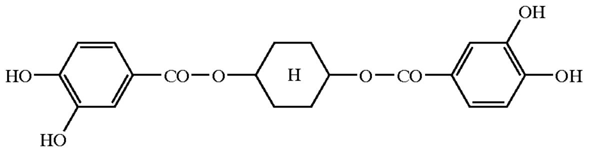
(I-28)
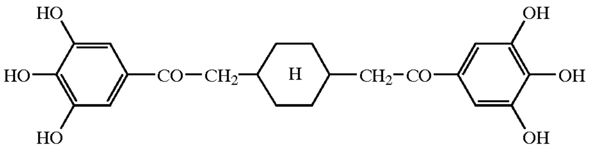
(I-29)
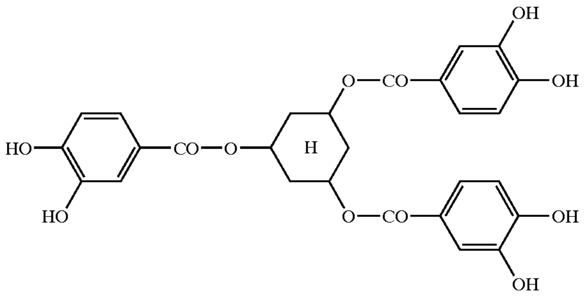

-continued
(I-30)
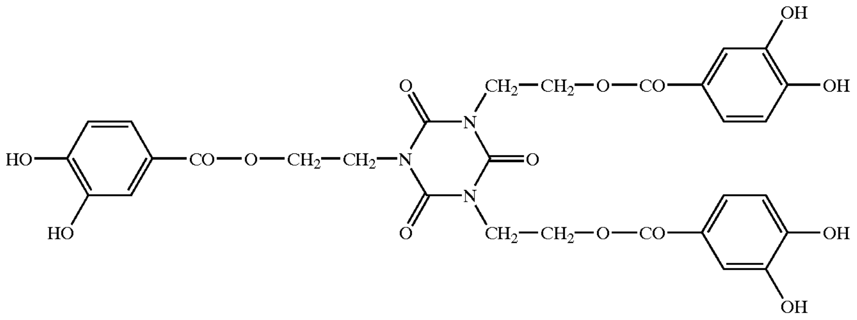
(I-31)
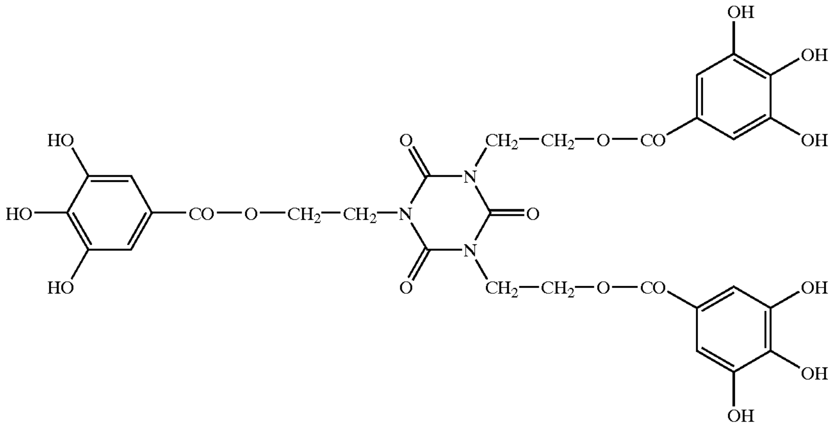
(I-32)
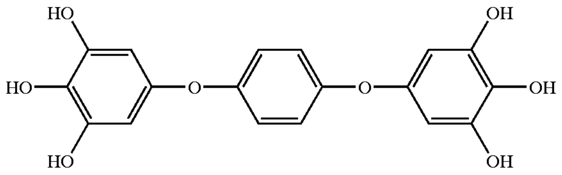
(I-33)
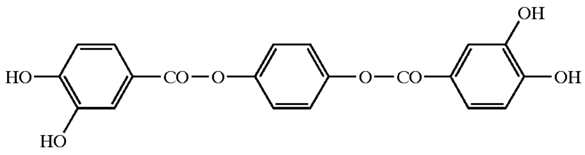
(I-34)
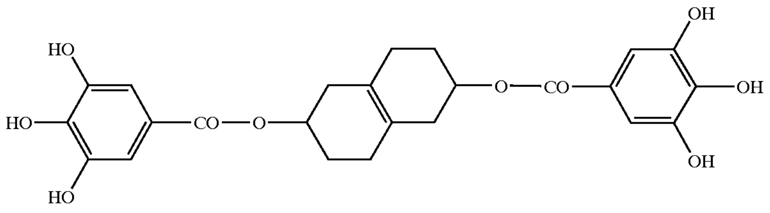
(I-35)
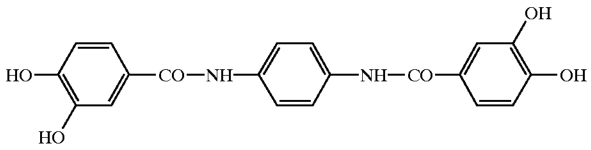
(I-36)
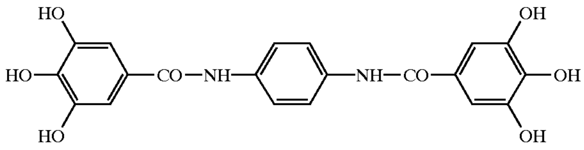

-continued
(I-37)
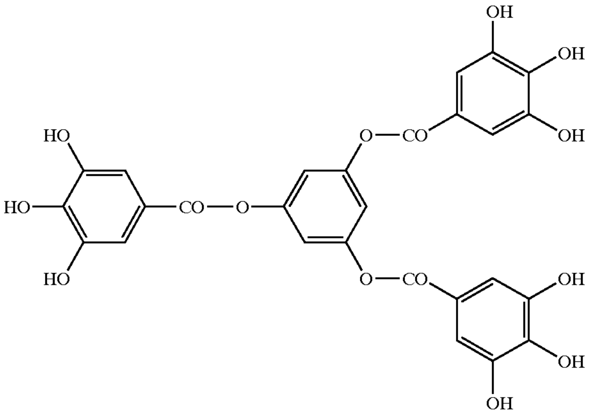
(I-38)
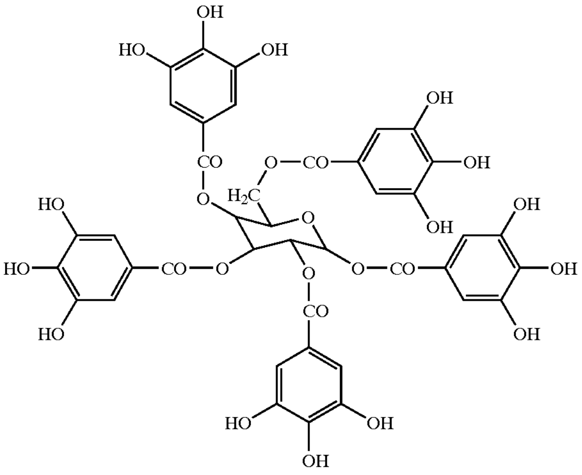
(I-39)
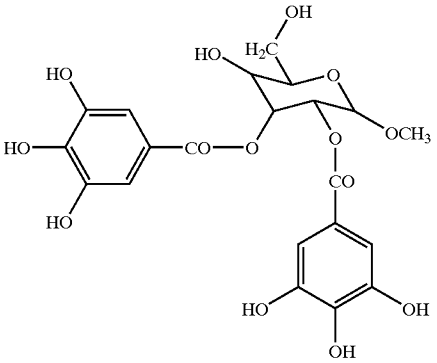
(I-40)
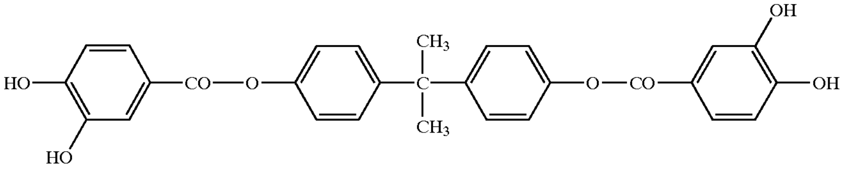
(I-41)
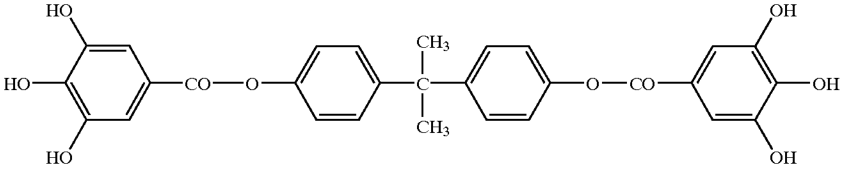
(I-42)
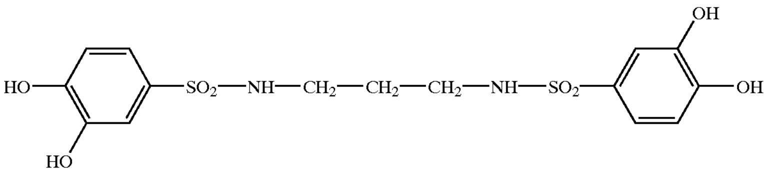
(I-43)
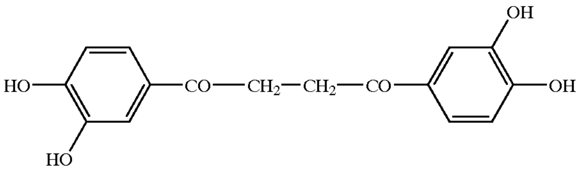
(I-44)
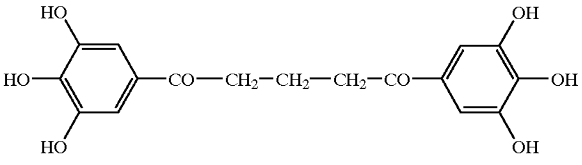

-continued (I-45)

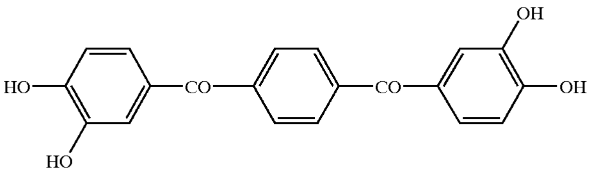

(I-46)

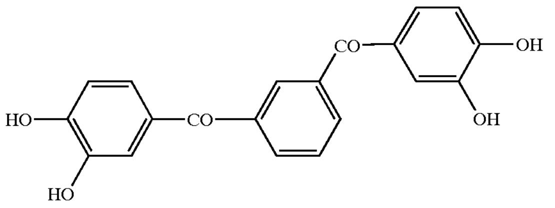

(I-47)

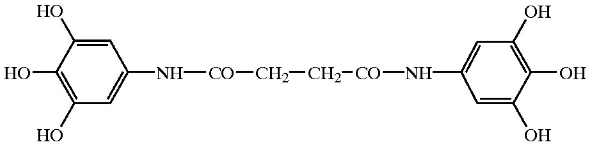

(I-48)

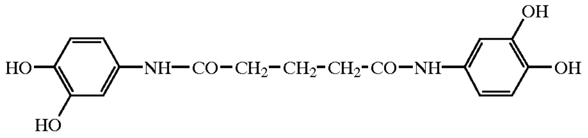

(I-49)

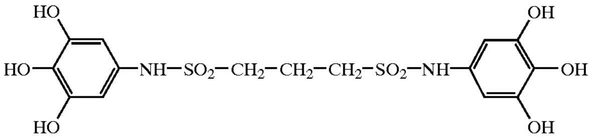

(I-50)

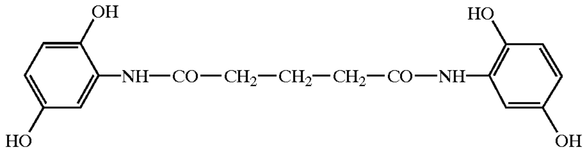

The tanning developing agent represented by the formula (I) can be synthesized according to a known method (for example, a method described in Biophysical Journal Vol. 71, 1966, pages 3261 to 3277).

[Tanning developing agent (second embodiment)]

A tanning developing agent used in the second embodiment of the present invention is a polymer having side chains containing benzenediol or benzenetriol rings.

The benzenediol or benzenetriol rings are connected to the end of the side chain preferably as monovalent groups (i.e., dihydroxyphenyl or trihydroxyphenyl, respectively). The benzenediol or benzenetriol rings are connected to the end of the side chain more preferably as 3,4-dihydroxyphenyl or 3,4,5-trihydroxyphenyl, respectively.

The benzenediol or benzenetriol rings may have a substituent group (e.g., an alkyl group, an alkoxy group, an aralkyl group, amino) other than hydroxyl. However, the benzenediol or benzenetriol rings preferably have no substituent group other than hydroxyl.

The benzenediol or benzenetriol rings are preferably connected to the main chain of the polymer by a linking group.

The linking group is preferably a divalent group selected from the group consisting of a divalent aliphatic group, a divalent aromatic group, a divalent heterocyclic group, —O—, —S—, —CO—, —NH—, $—SO_2—$, —SO— and a combination thereof. The linking group is more preferably a divalent group selected from the group consisting of a divalent aliphatic group, a divalent aromatic group, a divalent heterocyclic group, —O—, —CO—, —NH—, $—SO_2—$ and a combination thereof. The linking group is further preferably a divalent combined group of at least two of a divalent aliphatic group, a divalent aromatic group, a divalent heterocyclic group, —O—, —CO—, —NH— and $—SO_2—$. The linking group is most preferably a divalent combined group of at least three of them.

A preferred repeating unit of the polymer is represented by the formula (III).

(III)

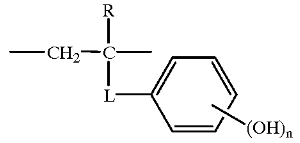

In the formula (III), L is a single bond or a divalent linking group selected from the group consisting of a divalent aliphatic group, a divalent aromatic group, a divalent heterocyclic group, —O—, —S—, —CO—, —NH—, $—SO_2—$, —SO— and a combination thereof. The aliphatic group, the aromatic group and the heterocyclic group can have a substituent group.

The aliphatic group has preferably 1 to 60, more preferably 1 to 30, further preferably 1 to 20, and most preferably 1 to 10 carbon atoms. The aliphatic group can be unsaturated (can have a double or triple bond). The aliphatic group can have a cyclic or branched structure.

The aromatic group preferably comprises a benzene or naphthalene ring, and more preferably comprises a benzene ring.

The heterocyclic group preferably comprises a 3 to 10 membered heterocyclic ring, more preferably comprises a 4 to 8 membered heterocyclic ring, and most preferably comprises a 5 or 6 membered heterocyclic ring. The heterocyclic ring preferably has a nitrogen, oxygen or sulfur atom as a hetero-atom. The heterocyclic ring can be condensed with an aliphatic ring, an aromatic ring or another heterocyclic ring. The heterocyclic ring can also be spiro-united with an aliphatic ring or another heterocyclic ring. Examples of the heterocyclic rings include pyrrolidine ring, piperidine ring, piperazine ring, morpholine ring, tetrahydrofuran ring, tetrahydropyran ring, tetrahydrothiophene ring, dioxane ring, oxazole ring, thiazole ring, pyridine ring, pyrazine ring, triazine ring, furan ring, thiophene ring and isocyanuric ring.

Examples of the substituent groups of the aliphatic group, the aromatic group and the heterocyclic group include hydroxyl, a halogen atom (e.g., chlorine), cyano, amino, a substituted amino group, a heterocyclic group, an acyl group and an acyloxy group. The substituent group of the substituted amino group is preferably an alkyl group or an aryl group.

The aromatic group and the heterocyclic group can have an alkyl group as the substituent group.

L is preferably a single bond or a divalent group selected from the group consisting of a divalent aliphatic group, a divalent aromatic group, a divalent heterocyclic group, —O—, —CO—, —NH—, $—SO_2—$ and a combination thereof. L is more preferably a divalent combined group of at least two of a divalent aliphatic group, a divalent aromatic group, a divalent heterocyclic group, —O—, —CO—, —NH— and $—SO_2—$. L is most preferably a divalent combined group of at least three of them.

Examples of the combined groups are shown below. In the following examples, the left side is attached to the main chain, and the right side is attached to the benzene ring. AL means a divalent aliphatic group, and AR means a divalent aromatic group.

L1: —CO—O—AL—O—CO—

L2: —CO—O—AL—NH—CO—

L3: —AR—AL—O—CO—

L4: —CO—NH—

L5: —CO—O—

L6: $—AR—SO_2—NH—$

L7: —AR—AL—

L8: —AR—CO—NH—AL—

L9: —CO—NH—AR—AL—

In the formula (III), the benzene ring can have a substituent group (e.g., an alkyl group, an alkoxy group, an aralkyl group) other than hydroxyl. However, the benzene ring preferably has no substituent group other than hydroxyl.

In the formula (III), R is hydrogen or methyl.

In the formula (III), n is 2 or 3.

Examples of the repeating units represented by the formula (III) are shown below.

(III-1)

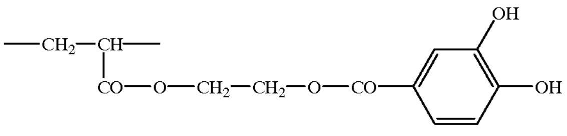

(III-2)

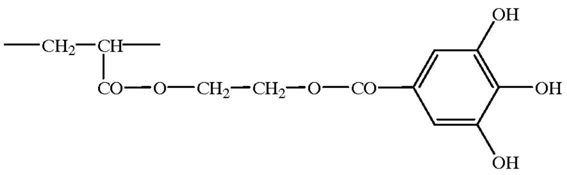

(III-3)

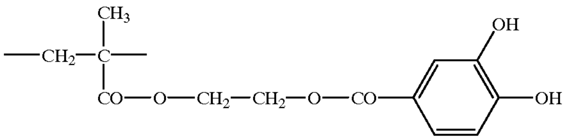

-continued (III-4)

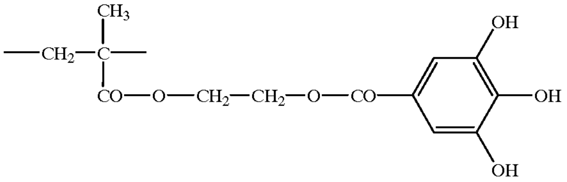

(III-5)

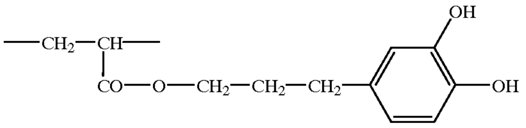

(III-6)

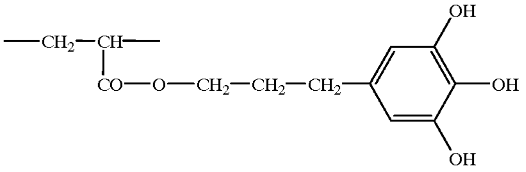

(III-7)

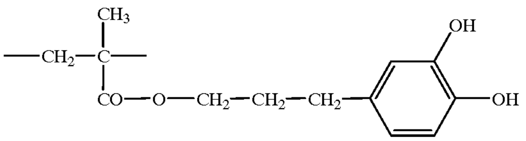

(III-8)

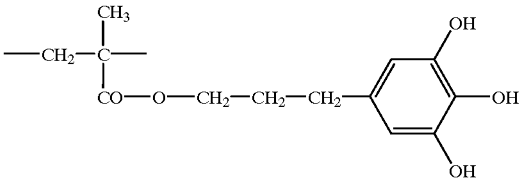

(III-9)

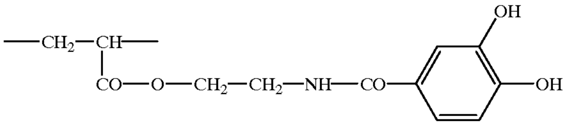

(III-10)

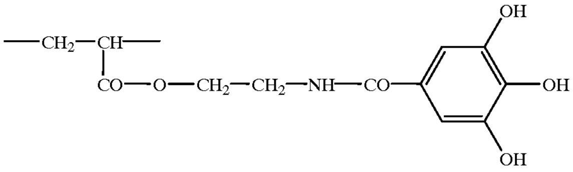

(III-11)

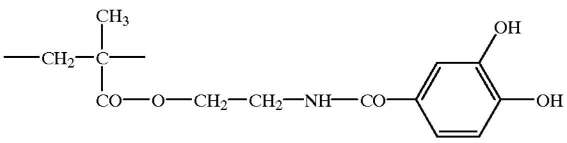

-continued
(III-12)
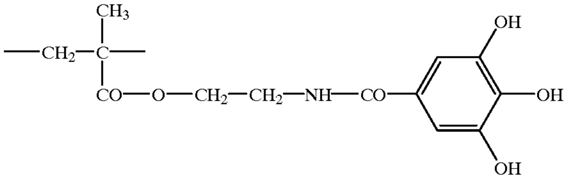
(III-13)
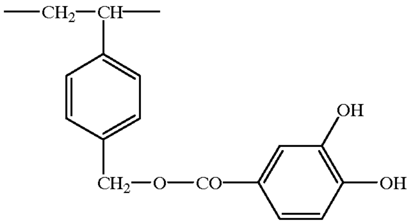
(III-14)
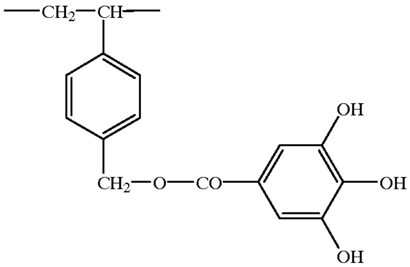
(III-15)
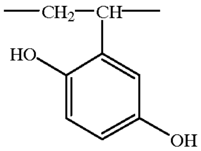
(III-16)
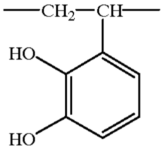
(III-17)
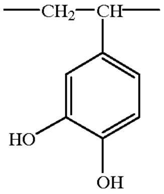
(III-18)
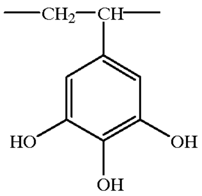
-continued
(III-19)
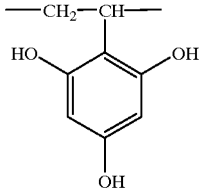
(III-20)
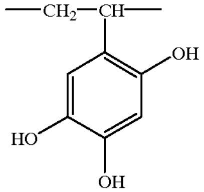
(III-21)
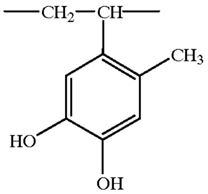
(III-22)
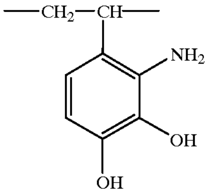
(III-23)
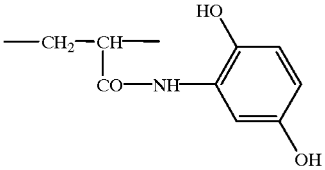
(III-24)
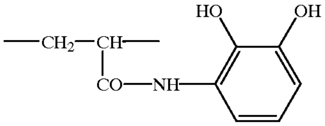
(III-25)
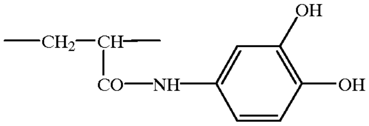
(III-26)
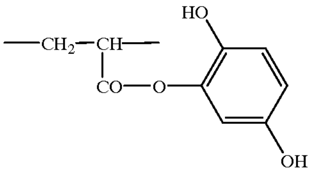

-continued
(III-27)
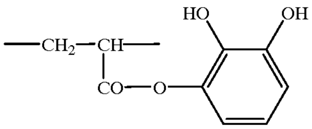
(III-28)
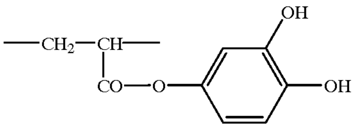
(III-29)
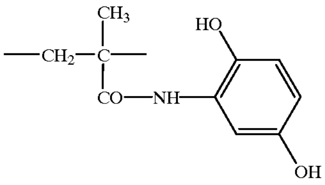
(III-30)
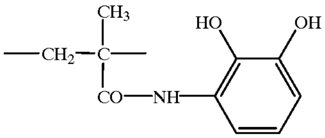
(III-31)
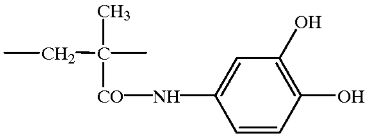
(III-32)
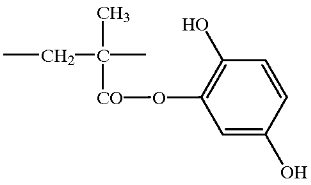
(III-33)
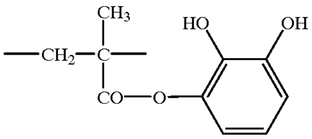
(III-34)
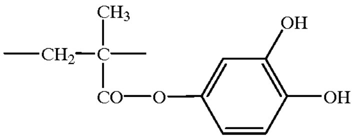
(III-35)
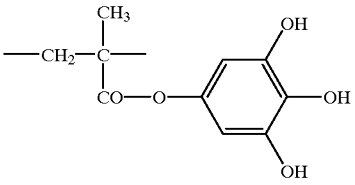
-continued
(III-36)
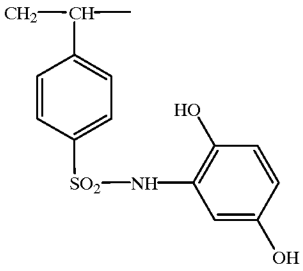
(III-37)
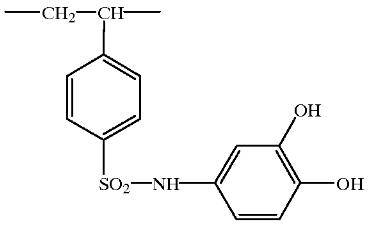
(III-38)
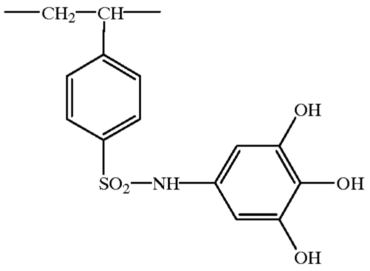
(III-39)
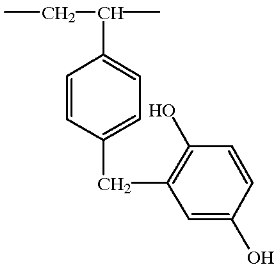
(III-40)
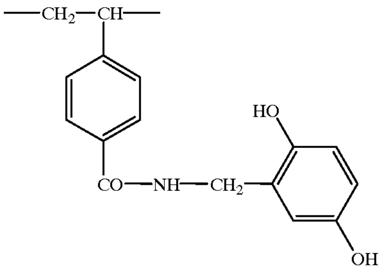
(III-41)
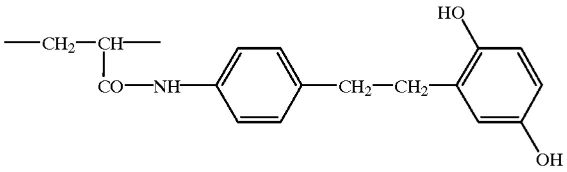
A homopolymer consisting of a repeating unit represented by the formula (III) can be used as the tanning developing agent. A copolymer comprising two or more repeattng units represented by the formula (III) can also be used as the tanning developing agent. Further, a copolymer comprising a repeating unit represented by the formula (III) and another repeating unit can be used as the tanning developing agent.

Other repeating units are preferably derived from ethylenically unsaturated monomers, such as an acrylic acid, methacrylic acid, an acrylic ester, a methacrylic ester, an acrylamide, a methacrylamide, a vinyl ester, styrene, a styrene derivative, an acrylonitrile, maleic anhydride and a maleimide. The other repeating units preferably have 20 or less carbon atom. The other repeating units can have a cross-linked structure.

Examples of the other repeating units are shown below.

(IV-1)

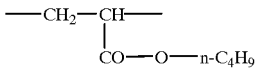

(IV-2)

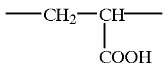

(IV-3)

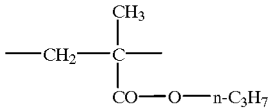

(IV-4)

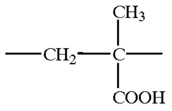

(IV-5)

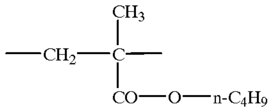

(IV-6)

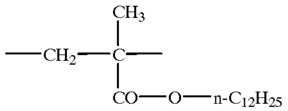

(IV-7)

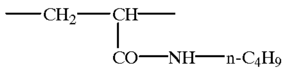

(IV-8)

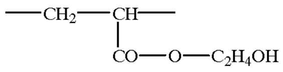

(IV-9)

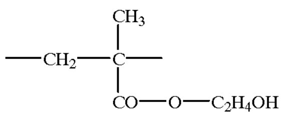

(IV-10)

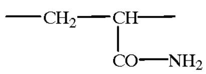

-continued (IV-11)

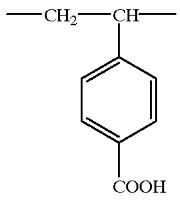

The copolymer comprises the repeating unit represented by the formula (III) preferably in the range of 5 to 99 mole %, and more preferably in the range of 10 to 90 mole %.

Examples of the copolymers are shown below. In the following examples, the ratio of the repeating unit means mole %.

CP1: -(III-1)$_{60}$-(IV-1)$_{20}$-(IV-2)$_{20}$-
CP2: -(III-2)$_{50}$-(IV-3)$_{30}$-(IV-4)$_{20}$-
CP3: -(III-3)$_{40}$-(IV-5)$_{40}$-(IV-2)$_{20}$-
CP4: -(III-4)$_{40}$-(IV-6)$_{40}$-(IV-4)$_{20}$-
CP5: -(III-6)$_{60}$-(IV-4)$_{20}$-(IV-2)$_{20}$-
CP6: -(III-9)$_{50}$-(IV-7)$_{20}$-(IV-8)$_{30}$-
CP7: -(III-10)$_{50}$-(IV-6)$_{30}$-(IV-2)$_{20}$-
CP8: -(III-39)$_{40}$-(IV-6)$_{30}$-(IV-2)$_{30}$-
CP9: -(III-2)$_{50}$-(IV-9)$_{30}$-(IV-4)$_{20}$-
CP10: -(III-4)$_{40}$-(IV-9)$_{40}$-(IV-2)$_{20}$-
CP11: -(III-5)$_{40}$-(IV-8)$_{40}$-(IV-2)$_{20}$-
CP12: -(III-8)$_{40}$-(IV-9)$_{40}$-(IV-10)$_{20}$-
CP13: -(III-10)$_{50}$-(IV-3)$_{30}$-(IV-2)$_{20}$-
CP14: -(III-12)$_{40}$-(IV-5)$_{30}$-(IV-4)30-
CP15: -(III-13)$_{70}$-(IV-11)$_{30}$-
CP16: - (III-41)$_{80}$- (IV-2)$_{20}$-

The polymer has a weight average molecular weight preferably in the range of 1,000 to 100,000, and more preferably in the range of 3,000 to 30,000.

The polymer can be synthesized according to a radical polymerization reaction by referring to a known method. In the case that phenolic hydroxyl in the monomer inhibits a polymerization reaction, the reaction can be conducted by protecting hydroxyl with an appropriate protective group (such as t-butyldimethylsilyl, trimethylsilyl). After the reaction, the protective group can be removed from hydroxyl to obtain the tanning developing agent.

Further, benzenediol or benzenetriol rings can be introduced into a polymer having a reactive group such as hydroxyl or amino by a polymer reaction to obtain the tanning developing agent.

[Tanning developing agent (third embodiment)]

A tanning developing agent used in the third embodiment of the present invention is a phenol compound represented by the formula (II).

(II)

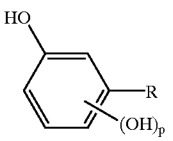

In the formula (II), p is 1 or 2. In the case that p is 1, the two hydroxyl groups are preferably arranged at o-positions (catechol derivatives) or p-positions (hydroquinone derivatives). In the case that p is 2, the three hydroxyl groups are preferably attached to the neighboring three carbon atoms of the benzene ring (pyrogallol derivatives).

In the formula (II), R is an aliphatic group having 5 to 40 carbon atoms, an aromatic group having 7 to 40 carbon atoms, an aliphatic acyl group having 5 to 40 carbon atoms, an aromatic acyl group having 7 to 40 carbon atoms, an aliphatic oxycarbonyl group having 5 to 40 carbon atoms, an aromatic oxycarbonyl group having 7 to 40 carbon atoms, an aliphatic acyloxy group having 5 to 40 carbon atoms, an aromatic acyloxy group having 7 to 40 carbon atoms, an aliphatic carbamoyl group having 5 to 40 carbon atoms or an aromatic carbamoyl group having 7 to 40 carbon atoms.

The aliphatic group has preferably 6 to 35, more preferably 7 to 30, further preferably 9 to 25, and most preferably 11 to 22 carbon atoms. The aliphatic group can be unsaturated (can have a double or triple bond). The aliphatic group can have a cyclic or branched structure. The aliphatic group can have a substituent group (e.g., a halogen atom, an aromatic group).

The aromatic group has preferably 7 to 35, more preferably 8 to 30, further preferably 9 to 25, and most preferably 10 to 22 carbon atoms. The aromatic group can have a substituent group (e.g., a halogen atom, an aliphatic group).

The aliphatic acyl group has preferably 6 to 35, more preferably 7 to 30, further preferably 9 to 25, and most preferably 11 to 22 carbon atoms. The aliphatic acyl group can be unsaturated (can have a double or triple bond). The aliphatic acyl group can have a cyclic or branched structure. The aliphatic acyl group can have a substituent group (e.g., a halogen atom, an aromatic group).

The aromatic acyl group has preferably 7 to 35, more preferably 8 to 30, further preferably 9 to 25, and most preferably 10 to 22 carbon atoms. The aromatic acyl group can have a substituent group (e.g., a halogen atom, an aliphatic group).

The aliphatic oxycarbonyl group has preferably 6 to 35, more preferably 7 to 30, further preferably 9 to 25, and most preferably 11 to 22 carbon atoms. The aliphatic oxycarbonyl group can be unsaturated (can have a double or triple bond). The aliphatic oxycarbonyl group can have a cyclic or branched structure. The aliphatic oxycarbonyl group can have a substituent group (e.g., a halogen atom, an aromatic group).

The aromatic oxycarbonyl group has preferably 7 to 35, more preferably 8 to 30, further preferably 9 to 25, and most preferably 10 to 22 carbon atoms. The aromatic oxycarbonyl group can have a substituent group (e.g., a halogen atom, an aliphatic group).

The aliphatic acyloxy group has preferably 6 to 35, more preferably 7 to 30, further preferably 9 to 25, and most preferably 11 to 22 carbon atoms. The aliphatic acyloxy group can be unsaturated (can have a double or triple bond). The aliphatic acyloxy group can have a cyclic or branched structure. The aliphatic acyloxy group can have a substituent group (e.g., a halogen atom, an aromatic group).

The aromatic acyloxy group has preferably 7 to 35, more preferably 8 to 30, further preferably 9 to 25, and most preferably 10 to 22 carbon atoms. The aromatic acyloxy group can have a substituent group (e.g., a halogen atom, an aliphatic group).

The aliphatic carbamoyl group has preferably 6 to 35, more preferably 7 to 30, further preferably 9 to 25, and most preferably 11 to 22 carbon atoms. The aliphatic carbamoyl group can be unsaturated (can have a double or triple bond). The aliphatic carbamoyl group can have a cyclic or branched structure. The aliphatic carbamoyl group can have a substituent group (e.g., a halogen atom, an aromatic group).

The aromatic carbamoyl group has preferably 7 to 35, more preferably 8 to 30, further preferably 9 to 25, and most preferably 10 to 22 carbon atoms. The aromatic carbamoyl group can have a substituent group (e.g., a halogen atom, an aliphatic group).

The phenol compound is more preferably a catechol, hydroquinone or pyrogallol derivative represented by the formula (IIa), (IIb), (IIc) or (IId).

(IIa)

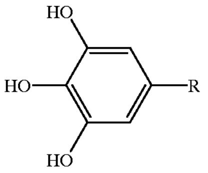

(IIb)

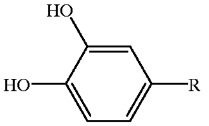

(IIc)

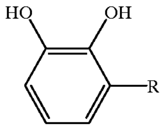

(IId)

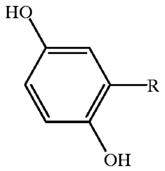

In the formulas (IIa), (IIb), (IIc) and (IId), R is an aliphatic group having 5 to 40 carbon atoms, an aromatic group having 7 to 40 carbon atoms, an aliphatic acyl group having 5 to 40 carbon atoms, an aromatic acyl group having 7 to 40 carbon atoms, an aliphatic oxycarbonyl group having 5 to 40 carbon atoms, an aromatic oxycarbonyl group having 7 to 40 carbon atoms, an aliphatic acyloxy group having 5 to 40 carbon atoms, an aromatic acyloxy group having 7 to 40 carbon atoms, an aliphatic carbamoyl group having 5 to 40 carbon atoms or an aromatic carbamoyl group having 7 to 40 carbon atoms. The definitions and examples of the groups are the same as R in the formula (II).

Examples of the phenol compounds represented by the formula (II) are shown below.

(II-1)

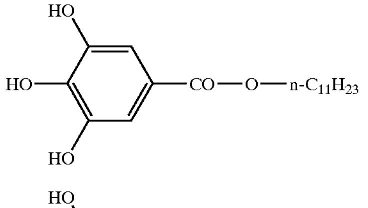

(II-2)

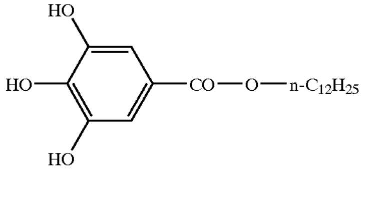

-continued
(II-3)
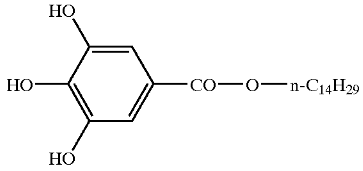
(II-4)
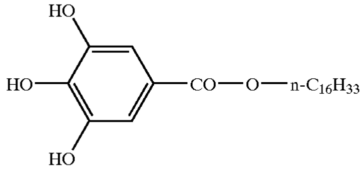
(II-5)
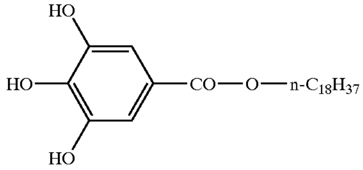
(II-6)
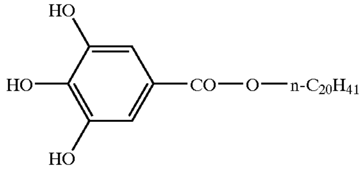
(II-7)
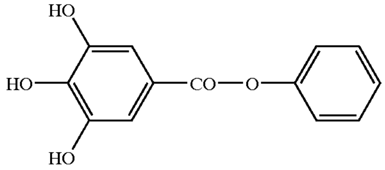
(II-8)
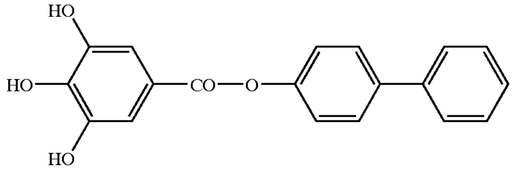
(II-9)
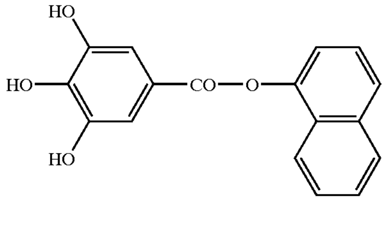
(II-10)
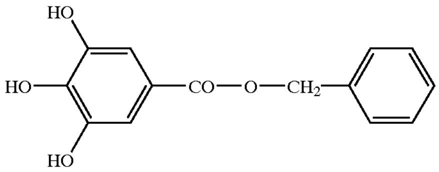
-continued
(II-11)
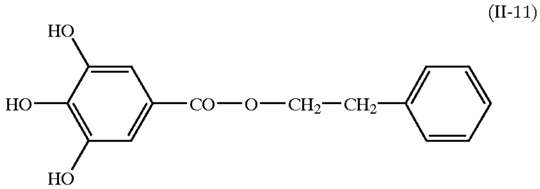
(II-12)
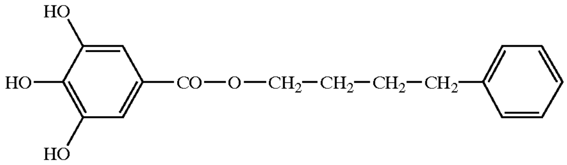
(II-13)
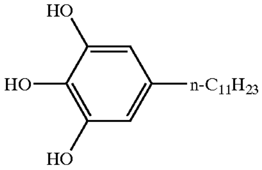
(II-14)
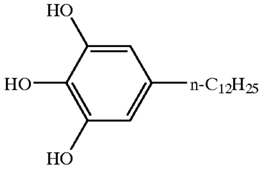
(II-15)
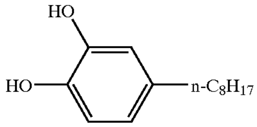
(II-16)
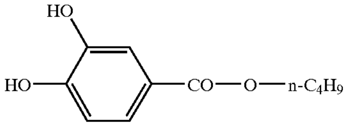
(II-17)
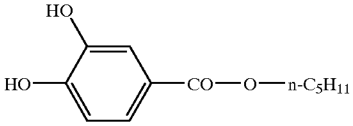
(II-18)
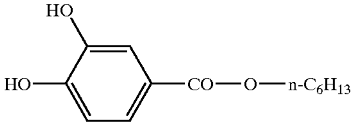
(II-19)
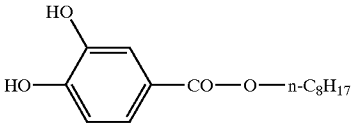
(II-20)
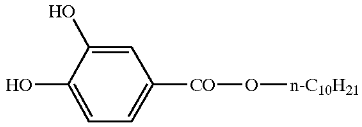

-continued
(II-21)
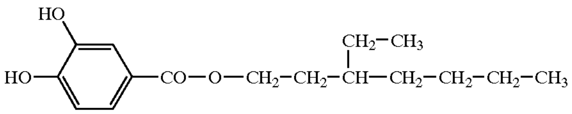
(II-22)
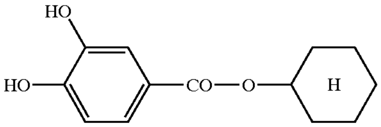
(II-23)
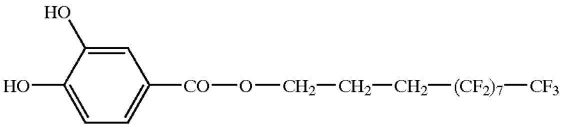
(II-24)
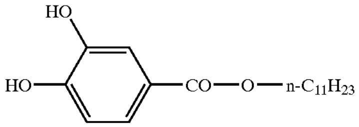
(II-25)
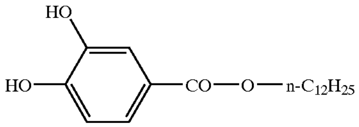
(II-26)
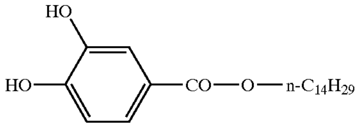
(II-27)
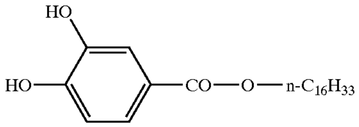
(II-28)
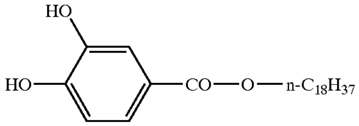
(II-29)
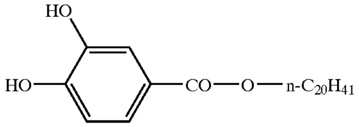
(II-30)
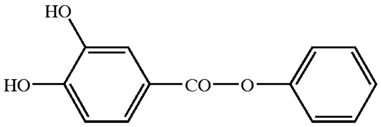
(II-31)
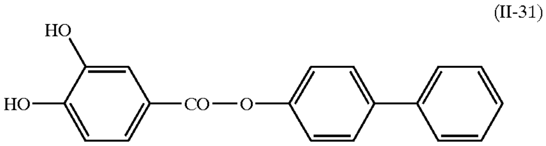
-continued
(II-32)
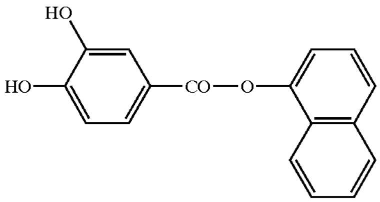
(II-33)
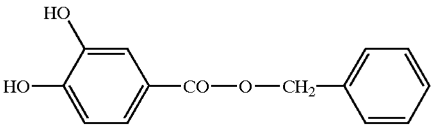
(II-34)
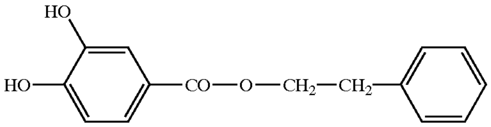
(II-35)
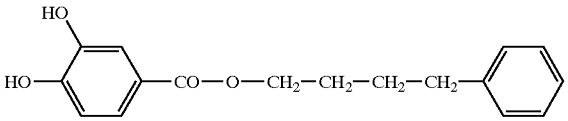
(II-36)
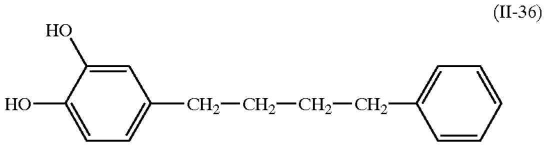
(II-37)
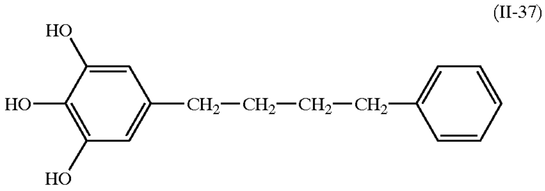
(II-38)
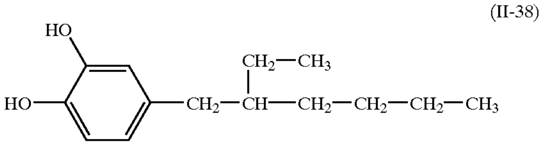
(II-39)
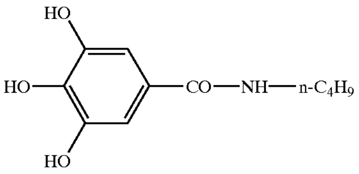
(II-40)
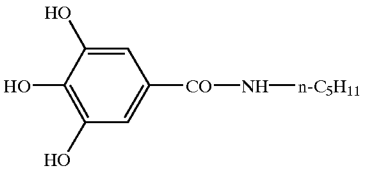
(II-41)
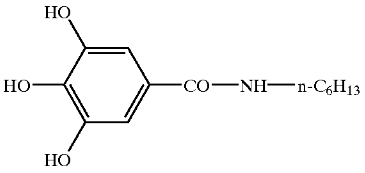

-continued
(II-42)
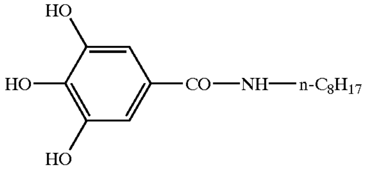
(II-43)
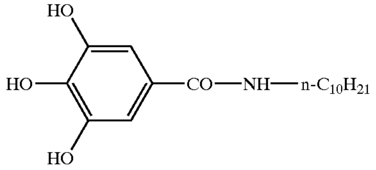
(II-44)
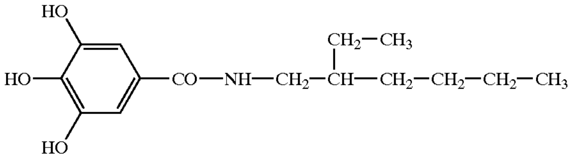
(II-45)
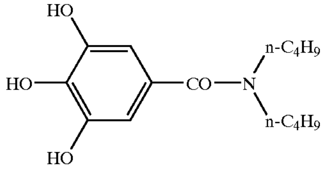
(II-46)
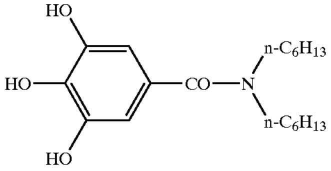
(II-47)
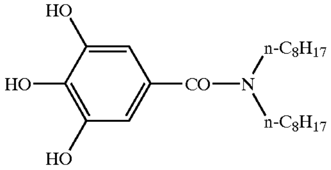
(II-48)
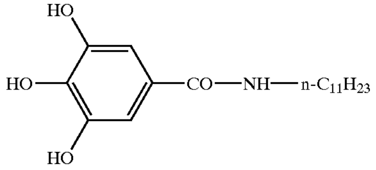
(II-49)
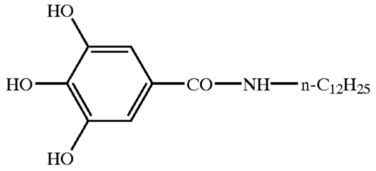
(II-50)
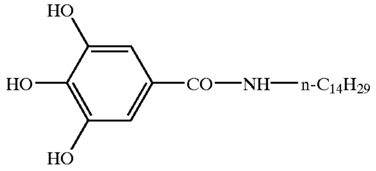
-continued
(II-51)
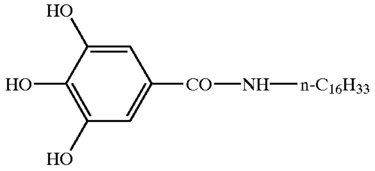
(II-52)
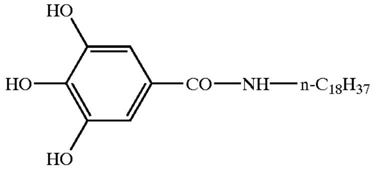
(II-53)
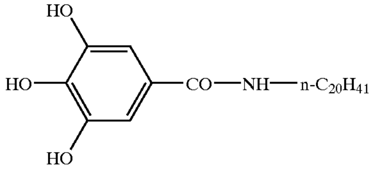
(II-54)
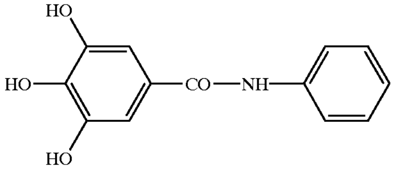
(II-55)
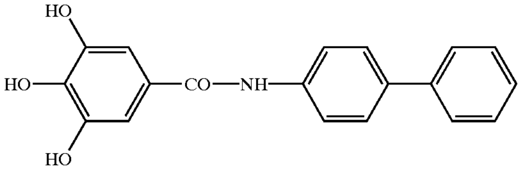
(II-56)
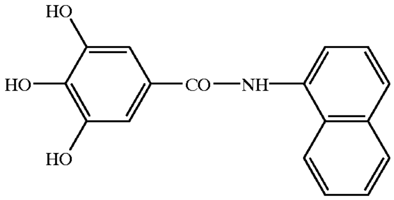
(II-57)
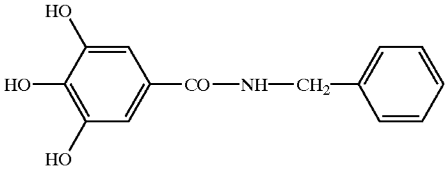
(II-58)
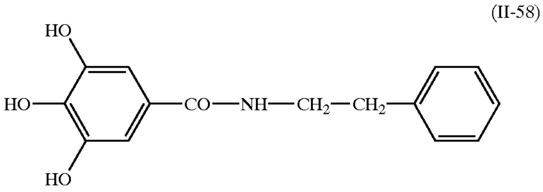

-continued
(II-59)
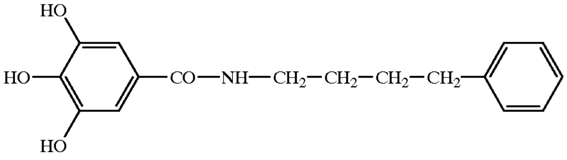
(II-60)
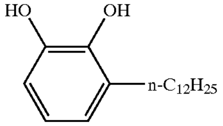
(II-61)
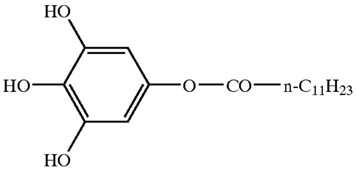
(II-62)
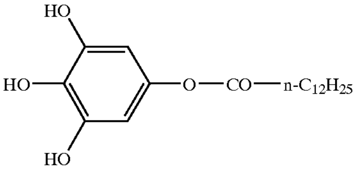
(II-63)
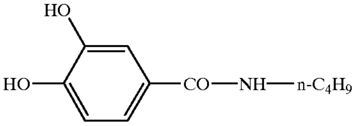
(II-64)
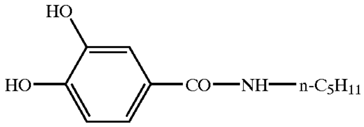
(II-65)
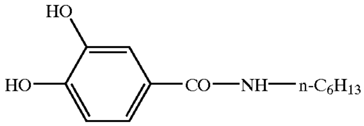
(II-66)
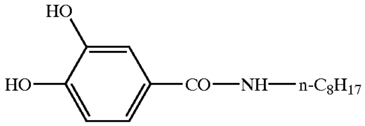
(II-67)
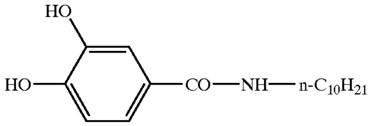
(II-68)
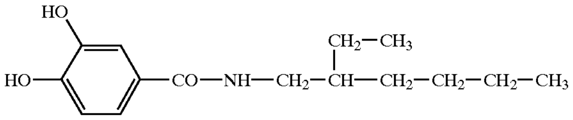
-continued
(II-69)
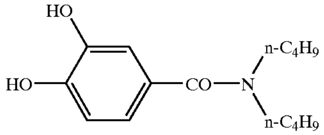
(II-70)
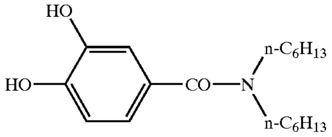
(II-71)
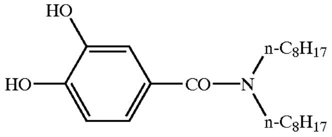
(II-72)
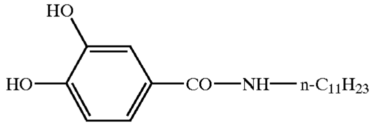
(II-73)
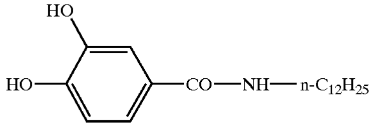
(II-74)
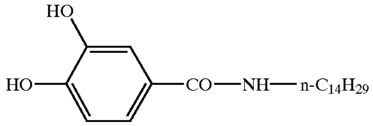
(II-75)
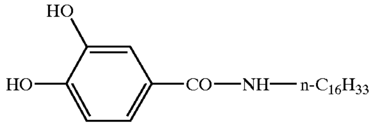
(II-76)
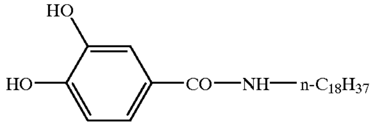
(II-77)
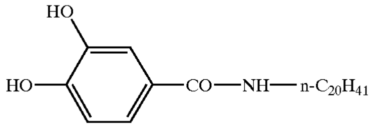
(II-78)
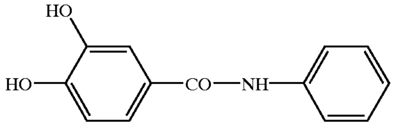
(II-79)
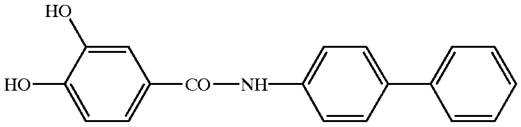

-continued
(II-80)
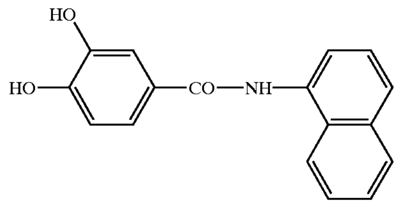
(II-81)
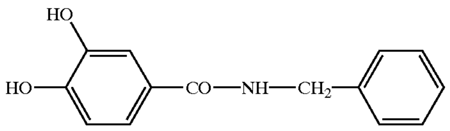
(II-82)
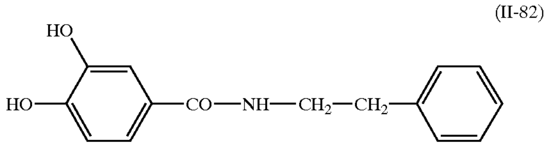
(II-83)
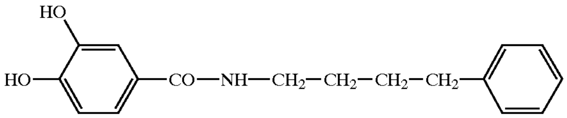
(II-84)
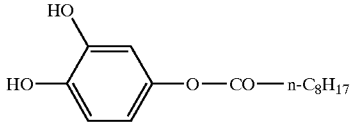
(II-85)
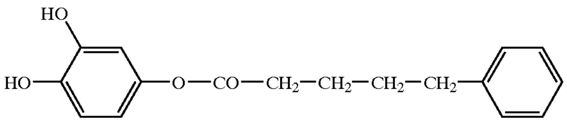
(II-86)
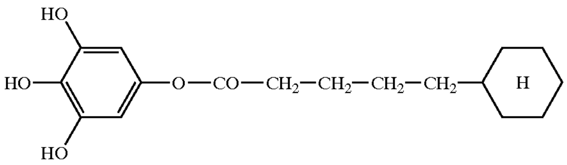
(II-87)
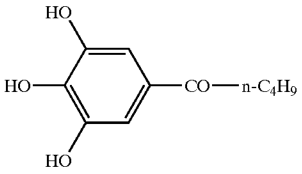
(II-88)
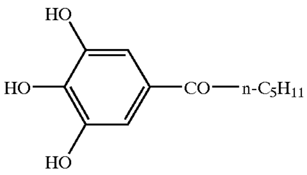
-continued
(II-89)
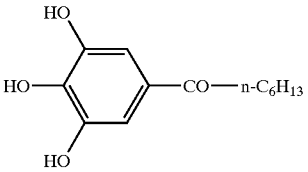
(II-90)
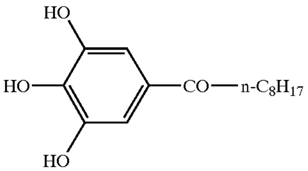
(II-91)
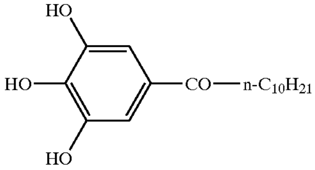
(II-92)
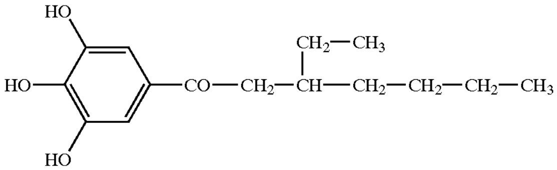
(II-93)
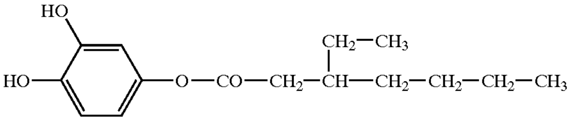
(II-94)
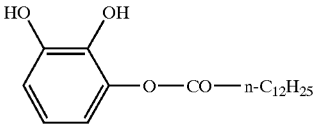
(II-95)
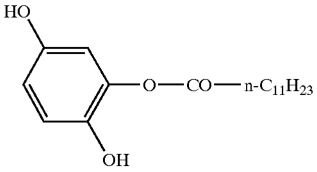
(II-96)
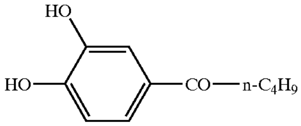
(II-97)
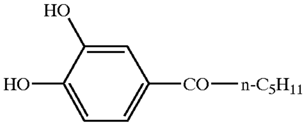
(II-98)
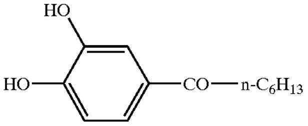

-continued
(II-99)
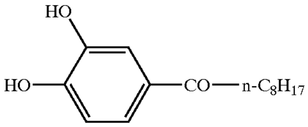
(II-100)
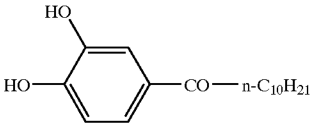
(II-101)
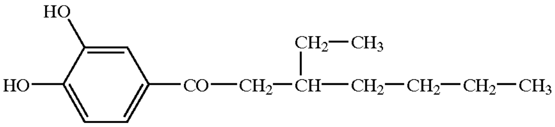
(II-102)
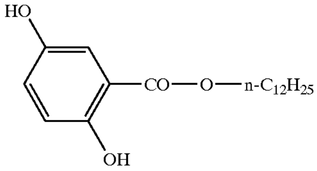
(II-103)
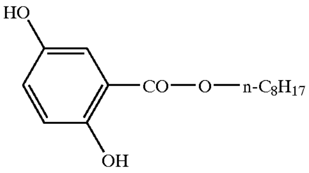
(II-104)
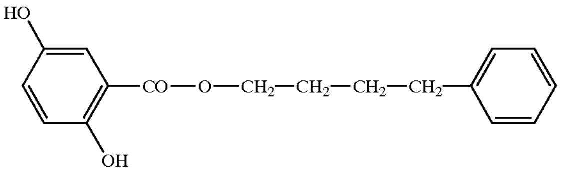
(II-105)
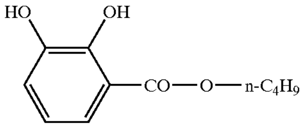
(II-106)
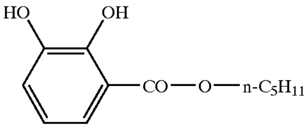
(II-107)
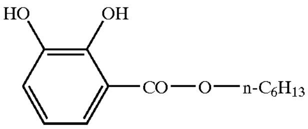
(II-108)
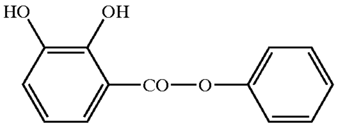
-continued
(II-109)
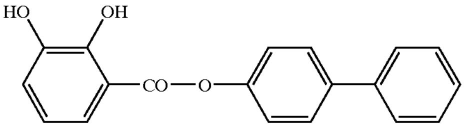
(II-110)
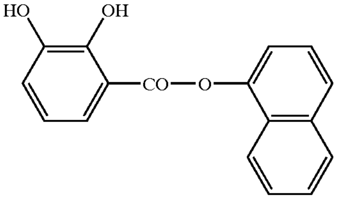
(II-111)
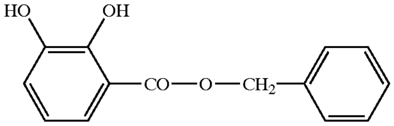
(II-112)
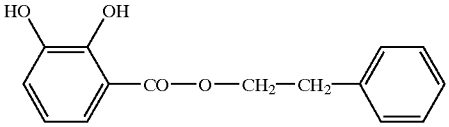
(II-113)
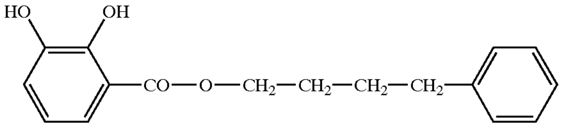
(II-114)
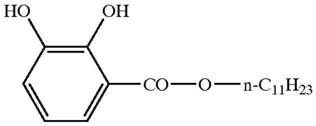
(II-115)
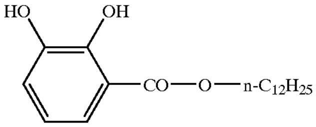
(II-116)
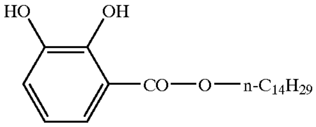
(II-117)
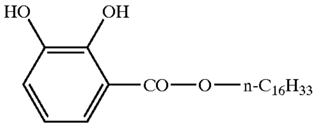
(II-118)
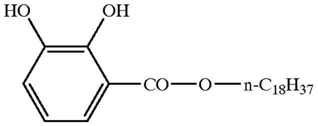
(II-119)
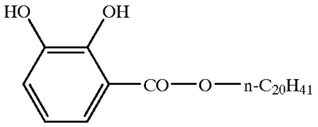

-continued (II-120)

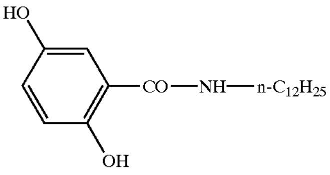

(II-121)

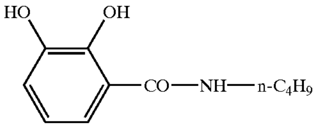

(II-122)

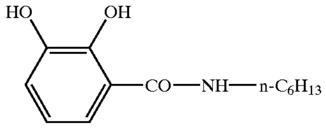

(II-123)

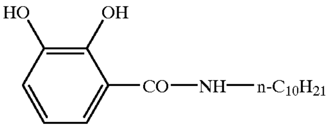

(II-124)

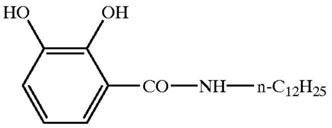

(II-125)

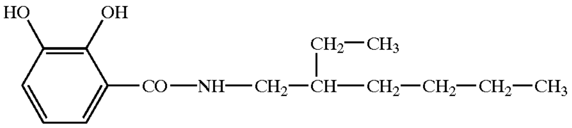

(II-126)

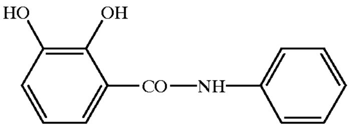

(II-127)

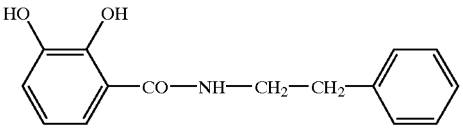

(II-128)

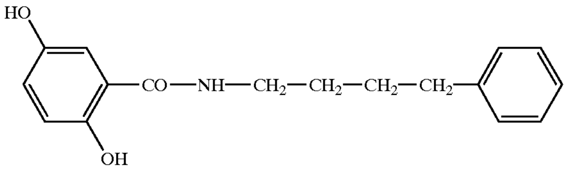

(II-129)

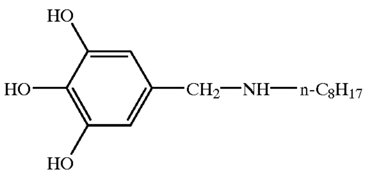

-continued (II-130)

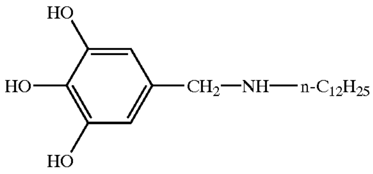

(II-131)

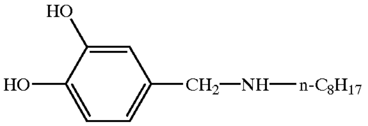

(II-132)

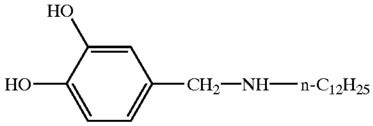

(II-133)

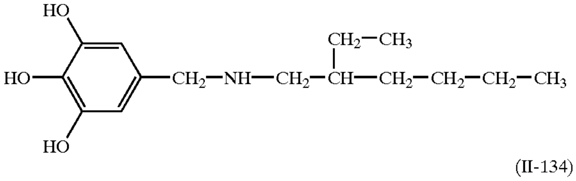

(II-134)

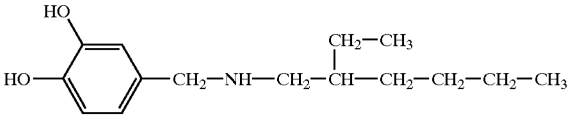

(II-135)

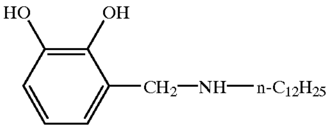

(II-136)

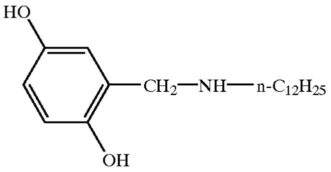

[Use of tanning developing agents]

Two or more tanning developing agents can be used in combination.

The tanning developing agent of the first embodiment (preferably a compound represented by the formula (I)) can be used in combination with the tanning developing agent of the second embodiment (preferably a polymer comprising a repeating unit represented by the formula (III)). The tanning developing agent of the first embodiment (preferably a compound represented by the formula (I)) can also be used in combination with the tanning developing agent of the third embodiment (a compound represented by the formula (II)). Further, the tanning developing agent of the second embodiment (preferably a polymer comprising a repeating unit represented by the formula (III)) can be used in combination with the tanning developing agent of the third embodiment (a compound represented by the formula (II)).

A combination of the first and third embodiments is particularly preferred. In the combination of the first and third embodiments, the molar ratio of embodiment (first:third) is preferably in the range of 1:99 to 99:1, more preferably in the range 2:98 to 98:2, further preferably in the range of 5:95 to 95:5, and most preferably in the range of 10:90 to 90:10.

The tanning developing agent of the first, second or third embodiment can be used in combination with a known tanning developing agent (e.g., hydroquinone, t-butylhydroquinone, catechol, phenylcatechol, pyrogallol, nordihydroguaiaretic acid, 3,3,3',3'-tetramethyl-5,6,5',6'-tetrahydroxyspiro-bis-indane). In that case that the tanning developing agent of the present invention is used in combination with the known agent, the amount of the agent of the present invention is preferably in the range of 50 to 95 wt. %, more preferably in the range of 60 to 90 wt. %, and most preferably 70 to 85 wt. % based on the total amount of the tanning developing agents.

The tanning developing agent can be used in combination with another (supplementary) developing agent. Examples of the supplementary developing agents include amidol, metol and aminophenol. Metol is particularly preferred. The amount of the supplementary developing agent is preferably in the range of 5 to 200 mole % based on the amount of the tanning developing agent.

The tanning developing agent is incorporated into a silver halide light-sensitive material or added to a tanning developing solution. The tanning developing agent is preferably incorporated into a silver halide light-sensitive material.

In the case of incorporating the tanning developing agent into a silver halide light-sensitive material, the agent is dissolved, emulsified or dispersed in a coating solution for a silver halide gelatin emulsion layer or an optionally provided hydrophilic layer. The tanning developing agent (except for a polymer of the second embodiment) is usually dissolved in the coating solution for a silver halide gelatin emulsion layer or a hydrophilic layer. The agent is added into the silver halide gelatin emulsion layer in an amount of preferably 0.01 to 1 mol/mol Ag, more preferably 0.03 to 1 mol/mol Ag.

In the case of adding the tanning developing agent to a tanning developing solution, the agent is dissolved, emulsified or dispersed in the developing solution. The agent is added into the solution in an amount of preferably $10^{-5}$ to $10^{-1}$ mol/l.

In the case that two or more tanning developing agents are used in combination, there is no specific limitation with respect to the arrangement of the two or more agents in the silver halide light-sensitive material. In the case that the tanning developing agent of the first embodiment is used in combination with the tanning developing agent of the third embodiment, the agent of the third embodiment is preferably added to the uppermost layer (the most remote layer from the support) of the silver halide light-sensitive material. In the case that the tanning developing agent of the first embodiment is used in combination with the tanning developing agent of the third embodiment, the layer containing the agent of the first embodiment is preferably different from the layer containing the agent of the third embodiment.

FIG. 1 is a sectional view schematically illustrating a silver halide light-sensitive material (according to a combination of the first and third embodiments).

The silver halide light-sensitive material shown in FIG. 1 comprises a hydrophilic support (1) and a silver halide gelatin emulsion layer (2). The silver halide gelatin emulsion layer (2) contains silver halide grains (21), gelatin (22), the tanning developing agent of the first embodiment (I) and the tanning developing agent of the third embodiment (II).

Figure 2:
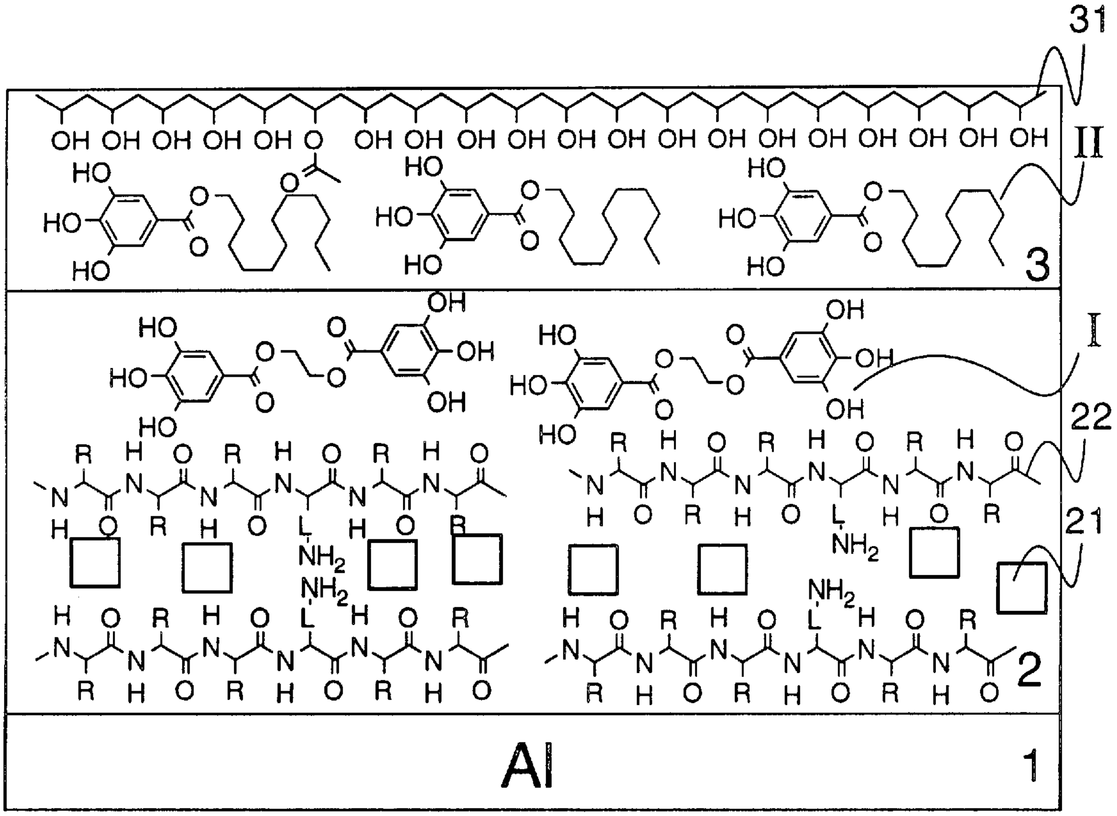
FIG. 2 is a sectional view schematically illustrating another silver halide light-sensitive material.

FIG. 2 is a sectional view schematically illustrating another silver halide light-sensitive material.

The silver halide light-sensitive material shown in FIG. 2 comprises a hydrophilic support (1), a silver halide gelatin emulsion layer (2) and a hydrophilic layer (3) in this order. The silver halide gelatin emulsion layer (2) comprises silver halide grains (21), gelatin (22) and the tanning developing agent of the first embodiment (I). The hydrophilic layer (3) contains a hydrophilic polymer (31) and the tanning developing agent of the third embodiment (II).

Figure 3:
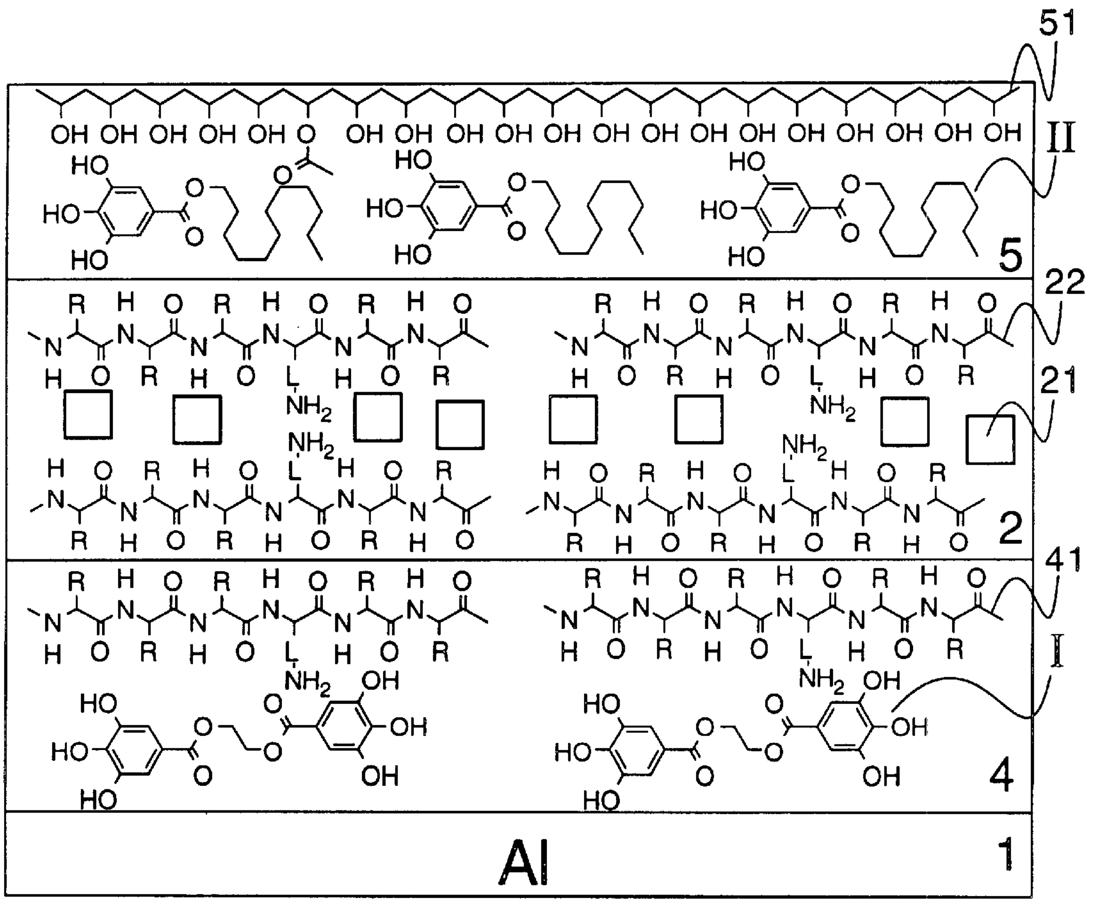
FIG. 3 is a sectional view schematically illustrating a further silver halide light-sensitive material.

FIG. 3 is a sectional view schematically illustrating a further silver halide light-sensitive material.

The silver halide light-sensitive material shown in FIG. 3 comprises a hydrophilic support (1), a first hydrophilic layer (4), a silver halide gelatin emulsion layer (2) and a second hydrophilic layer (5) in this order. The first hydrophilic layer (4) contains gelatin (41) and the tanning developing agent of the first embodiment (I). The silver halide gelatin emulsion layer (2) comprises silver halide grains (21) and gelatin (22). The second hydrophilic layer (5) contains a hydrophilic polymer (51) and the tanning developing agent of the third embodiment (II).

Figure 4:
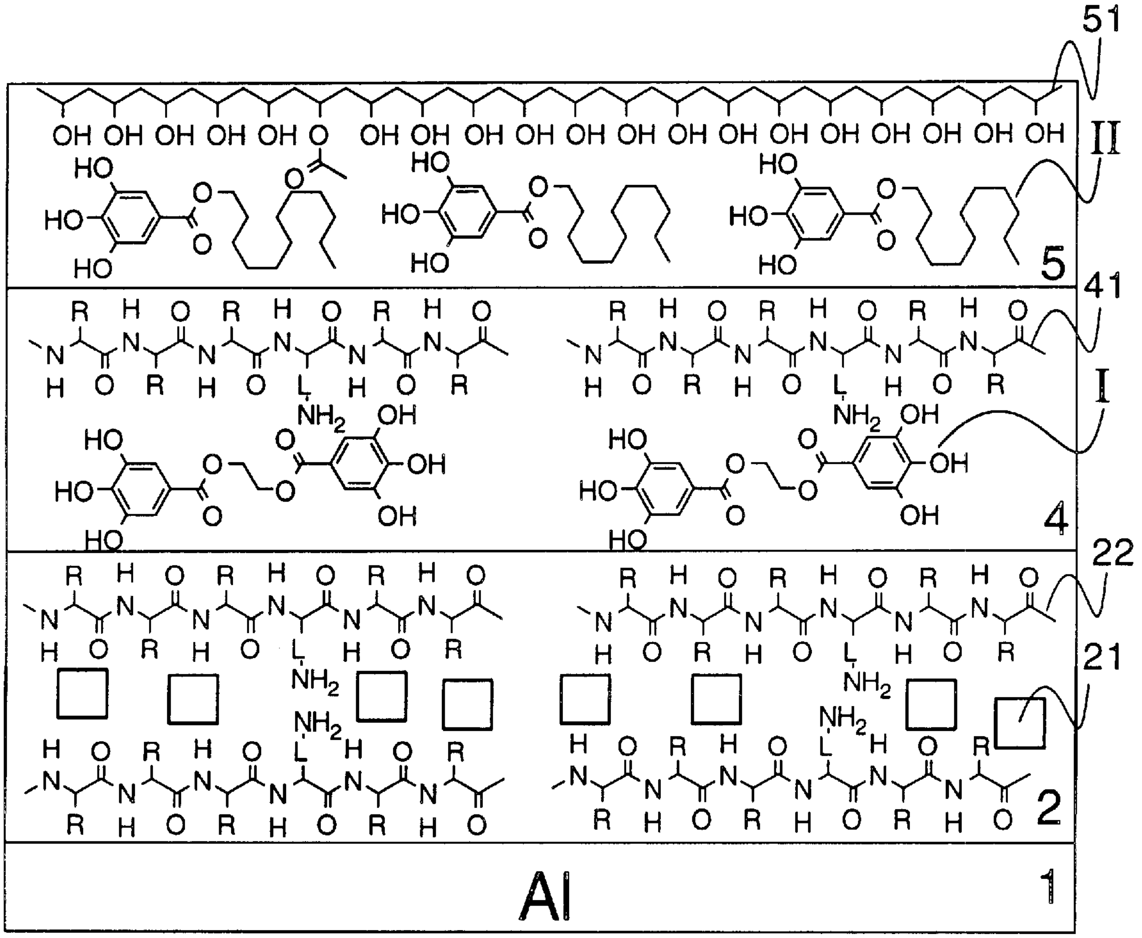
FIG. 4 is a sectional view schematically illustrating a furthermore silver halide light-sensitive material.

FIG. 4 is a sectional view schematically illustrating a furthermore silver halide light-sensitive material.

The silver halide light-sensitive material shown in FIG. 4 comprises a hydrophilic support (1), a silver halide gelatin emulsion layer (2), a first hydrophilic layer (4) and a second hydrophilic layer (5) in this order. The silver halide gelatin emulsion layer (2) comprises silver halide grains (21) and gelatin (22). The first hydrophilic layer (4) contains gelatin (41) and the tanning developing agent of the first embodiment (I). The second hydrophilic layer (5) contains a hydrophilic polymer (51) and the tanning developing agent of the third embodiment (II).

[Support]

The support can be made of a paper, a synthetic paper, a paper laminated with a synthetic resin (e.g., polyethylene, polypropylene, polystyrene), a plastic (e.g., polyethylene terephthalate, polycarbonate, polyimide, Nylon, cellulose triacetate) film, a metal (e.g., aluminum, aluminum alloy, zinc, iron, copper) plate or a paper or plastic film laminated with the metal. Further, the metal can be evaporated onto the paper or plastic film to form the support.

In the case that the light-sensitive material is used for the preparation of a lithographic plate, the support is preferably made of aluminum, plastic, paper or synthetic paper. A complex sheet can also be used as the support. For example, an aluminum sheet can be laminated on the polyethylene terephthalate film. An aluminum or plastic support is preferred, and an aluminum support is particularly preferred.

The lithographic plate usually has a hydrophilic support. A hydrophobic material such as plastic can also be used to prepare the hydrophilic support by forming a hydrophilic undercoating layer.

The aluminum support is described below in more detail.

The aluminum support can be subjected to a graining treatment to form a rough surface or to a hydrophilic treatment to form a hydrophilic surface.

The treatment for the rough surface can be conducted by an electrochemical graining treatment and/or a mechanical graining treatment. According to the electrochemical graining treatment, a current passes through an aluminum plate in an electrolytic solution of hydrochloric acid or nitric acid. The mechanical graining treatment includes a wire brushing method, a ball graining method and a brash graining method. In the wire brushing method, the surface of aluminum plate is scratched with a metal wire. In the ball graining method, the surface of aluminum plate is grained with graining balls and a graining agent. In the brash graining method, the surface is grained with a Nylon brash and a graining agent.

The grained aluminum plate is then chemically etched with an alkali or an acid. An alkali etching method is industrially advantageous. Examples of the alkali agents include sodium carbonate, sodium aluminate, sodium metasilicate, sodium phosphate, sodium hydroxide, potassium hydroxide and lithium hydroxide. The alkali solution preferably has a concentration in the range of 1 to 50 wt. %. The temperature of the alkali treatment is preferably in the range of 20 to 100° C. The treatment conditions are preferably so adjusted that the amount of the dissolved aluminum may be in the range of 5 to 20 g/$m^2$.

The aluminum plate is usually washed with an acid to remove smut from the surface after the alkali etching treatment. Examples of the acids include nitric acid, sulfuric acid, phosphoric acid, chromic acid, hydrofluoric acid and borofluoric acid.

The smut removing treatment can also be conducted according to a conventional method after the electrochemical graining treatment. For example, an aluminum plate can be treated with 15 to 65 wt. % sulfuric acid at a temperature of 50 to 90° C.

The surface treated aluminum plate can be subjected to an anodizing treatment or a chemical treatment. The anodizing treatment can be conducted according to a conventional method. In more detail, a direct or alternative current passes through an aluminum plate in a solution of an acid to form an anodic oxide layer on the surface of the plate. Examples of the acids include sulfuric acid, phosphoric acid, chromic acid, oxalic acid, sulfamic acid and benzenesulfonic acid. The conditions of the anodizing treatment depend on the contents of the electrolytic solution. The concentration of the electrolytic solution is preferably in the range of 1 to 80 wt. %, the temperature of the solution is preferably in the range of 5 to 70° C., the current density is preferably in the range of 0.5 to 60 A/$dm^2$, the voltage is preferably in the range of 1 to 100 v, and the time for the electrolysis is preferably in the range of 10 to 100 seconds.

The anodizing treatment is preferably conducted in sulfuric acid at a high current density. Phosphoric acid is also preferably used for the anodizing treatment.

After the anodizing treatment, the aluminum plate can be treated with an alkali metal silicate. For example, the aluminum plate can be immersed in an aqueous solution of sodium silicate. An undercoating layer can be provided on the aluminum support to improve the adhesion between the support and the hardening layer or to improve a printing character.

[Undercoating layer]

An undercoating layer (hydrophilic layer) can be provided on not only the above-mentioned aluminum support, but also a support having a hydrophobic (or not sufficiently hydrophilic) surface (e.g., a polymer film).

Examples of the components of the undercoating layer include a polymer (e.g., gelatin, casein, polyvinyl alcohol, ethyl cellulose, phenol resin, styrene-maleic anhydride resin, polyacrylic acid), an amine (e.g., monoethanol amine, diethanol amine, triethanol amine, tripropanol amine) and a salt thereof (e.g., chloride, oxalate, phosphate), an monoaminomonocarboxylic acid (e.g., aminoacetic acid, alanine), an oxyamino acid (e.g., serine, threonine, dihydroxyethylglycine), a sulfur-containing amino acid (e.g., cysteine, cystine), a monoaminodicarboxylic acid (e.g., aspartic acid, glutamic acid), a diaminomonocarboxylic acid (e.g., lysine), an aromatic amino acid (e.g., p-hydroxylphenylglycine, phenylalanine, anthranil), an aliphatic aminosulfonic acid (e.g., sulfamic acid, cyclohexylsulfamic acid) and a (poly)aminopolyacetic acid (e.g., ethylenediaminetetraacetic acid, nitrilotriacetic acid, iminodiacetic acid, hydroxyethyliminodiacetic acid, hydroxyethylethylenediamineacetic acid, ethylenediaminediacetic acid, cycloethylenediaminetetraacetic acid, diethylenetriaminepentaaceitic acid, glycoletherdiaminetetraacetic acid). All or a part of the acidic groups of the above-mentioned compounds may form salts (e.g., sodium salt, potassium salt, ammonium salt), and these salts are also usable. Two or more components can be used in combination.

In the case that a polymer film is used as a support, hydrophilic fine particles (e.g., silica particles) are preferably added to a hydrophilic undercoating layer in place of the graining treatment of an aluminum support.

[Silver halide emulsion layer]

The silver halide emulsion layer generally contains gelatin as a binder. The gelatin is hardened by tanning development to form a relief image. Tanning development can be also applied to a hydrophilic polymer having an amido bond or a primary amino group such as polyacrylamide and a protein other than gelatin. However, the tanning development is usually applied to gelatin. Other hydrophilic polymers (e.g., polyvinyl pyrrolidone, starch, albumin, polyvinyl alcohol, gum arabic, hydroxyethyl cellulose) can be used in combination with gelatin.

The coating amount of silver halide is preferably in the range of 0.01 to 5 g/$m^2$, more preferably in the range of 0.03 to 1 g/$m^2$, and most preferably in the range of 0.05 to 0.3 g/$m^2$, in terms of silver amount.

The silver halide emulsion layer preferably has a thickness in the range of 0.07 to 13 $\mu$m, and more preferably in the range of 0.2 to 5 $\mu$m.

Silver halide is silver chloride, silver bromide, silver iodide, silver chlorobromide, silver chloroiodide, silver iodobromide or silver chloroiodobromide in the form of grains.

The crystal forms of silver halide grains preferably are cubic or tetradecahedron. Irregular forms and mixed forms as well as the above mentioned regular forms can be used in the silver halide emulsions. Examples of the irregular forms include a potato-like form, a spherical form and a tabular form. The tabular form usually has an aspect ratio (diameter per thickness) of 5 or more.

The silver halide grains may be extremely small grains having a grain diameter (diameter of projected area) of less than 0.01 $\mu$m. The grains may also be relatively large grains having a diameter of about 10 $\mu$m. A monodispersed emulsion is preferred to a polydispersed emulsion. The monodispersed emulsion is described in U.S. Pat. Nos. 3,574,628, 3,655,394 and British Patent No. 1,413,748.

With respect to the crystal structure of the silver halide grains, the individual grains have a homogeneous halogen composition or a heterogeneous halogen composition. In the heterogeneous composition, the composition varies from the outer surface portion to the inside portion. The grains may have a multi-layered structure. Further, the silver halide grains may be conjugated with other silver halide grains having different halogen composition through epitaxial conjugation. The grains may be conjugated with compounds other than the silver halide such as silver rhodanate and lead oxide.

Various substances in the form of salt can be added to the silver halide grains. Examples of the substances include copper, thallium, lead, bismuth, cadmium, zinc, chalcogens (e.g., sulfur, selenium, tellurium), gold, and noble metals of group VIII (e.g., rhodium, iridium, iron, platinum, palladium). The salts are added to the emulsion during the grain formation or after the grain formation according to a conventional process. The conventional process is described in U.S. Pat. Nos. 1,195,432, 1,951,933, 2,448,060, 2,628,167, 2,950,972, 3,488,709, 3,737,313, 3,772,031, 4,269,927 and Research Disclosure (RD), No. 13,452 (June 1975).

The silver halide grains can be doped with iridium ion by adding an aqueous solution of an iridium compound into a silver halide emulsion. Examples of water-soluble iridium compounds include hexachloroiridic(III) salts and hexachloroiridic(IV) salts. The silver halide grains can also be doped with rhodium ion by adding an aqueous solution of a rhodium compound into a silver halide emulsion. Examples of water-soluble rhodium compounds include rhodium ammonium chloride, rhodium trichloride and rhodium chloride.

The iridium compound or the rhodium compound can be dissolved in a halide solution for forming silver halide grains. The aqueous solution of the iridium compound or the rhodium compound can be used before or after the grain formation. Further, the solution can be added to the emulsion between the grain formation and a chemical sensitization. The solution is preferably added at the stage of the grain formation. The iridium or rhodium ion is preferably used in an amount of $10^{-8}$ to $10^{-3}$ mol, and more preferably in an amount of $10^{-7}$ to $10^{-5}$ mol based on 1 mol of silver halide.

Two or more kinds of silver halide grains that differ in halogen composition, crystal habit, grain size, or other features can be used in combination.

The silver halide is preferably used in the form of an emulsion. The silver halide emulsion can be prepared by known processes, which are described in Research Disclosure (RD), No. 17643, pages 22 to 23 (December 1978), (Emulsion preparation and types); and Research Disclosure, No. 18716, page 648, (November 1979).

The silver halide emulsion is generally subjected to a chemical sensitization after a physical ripening. The silver halide grains preferably have a low fogging value.

Various additives can be used in the ripening or sensitizing steps. The additives are described in Research Disclosure, No. 17,643 and No. 18,716. The chemical sensitizer is described in No. 17,643 (page 23) and No. 18,716 (page 648, right column). Other additives are also described in Research Disclosure. For example, a sensitivity-increasing agent is described in No. 18,716 (page 648, right column). An anti-fogging agent and a stabilizer are described in No. 17,643 (pages 24 to 25) and No. 18,716 (page 649, right column), respectively.

The silver halide emulsion is usually subjected to a spectral sensitization. Various spectral sensitizing dyes are known in a conventional silver halide photography. Examples of the sensitizing dyes include cyanine dyes, merocyanine dyes, complex merocyanine dyes, holopolar cyanine dyes, hemicyanine dyes, styryl dyes and hemioxonol dyes.

The spectral sensitizing dyes can be used to adjust the spectral sensitivity of the light-sensitive material to wavelength of two or more light sources such as various laser beams (e.g., semiconductor laser, helium neon laser, argon ion laser, helium cadmium laser, YAG laser) and a light emission diode. For example, two or more sensitizing dyes are used for silver halide grains in a light-sensitive layer so that a light-sensitive material can be exposed to two or more light sources.

A supersensitizer can be added to the emulsion in addition to the sensitizing dye. The supersensitizer itself has neither a spectral sensitization effect nor an absorption of visible light, but shows a supersensitizing effect on the sensitizing dye.

The spectral sensitizing dyes are described in Research Disclosure No. 17643 (December 1978), pages 23 to 24. The supersensitizers are described in Research Disclosure No. 18716 (November 1979), page 649.

Fine particles of oleophilic resin can be added into the silver halide emulsion layer to make the relief image more oleophilic. The oleophilic resin particles also improve mechanical strength of the relief image.

Examples of the oleophilic resin include polyester, polyamide, phenol-aldehyde resin, polyvinyl chloride, epoxy resin. silicone resin, alkylphenol resin, ketone resin, alkyd resin, polystyrene, polyacrylate, rosin modified maleic acid resin, rosin modified fumaric acid resin, polyvinyl acetate, hydroxypropylmethyl cellulose, rosin modified phenol resin and hexahydrophthalate. A light-sensitive resin (photo-polymerizable polymer, photo-crosslinkable polymer) is also usable as the oleophilic resin. Two or more oleophilic resins can be used in combination.

The fine particles of oleophilic resin preferably have a mean diameter of 0.01 to 5 μm. There is no particular restriction on the shape of the particles.

The light-sensitive material can contain an antifogging agent, a silver development accelerator or a stabilizer. Examples of these compounds include mercapto compounds (described in Japanese Patent Provisional Publication No. 59(1984)-111636), azoles or azaindenes (described in Research Disclosure No. 17643 (1978), pages 24 to 25), nitrogen-containing carboxylic acids or phosphoric acids (described in Japanese Patent Provisional Publication No. 59(1984)-168442), cyclic amides (described in Japanese Patent Provisional Publication No. 61(1986)-151841), thioethers (described in Japanese Patent Provisional Publication No. 62(1987)-151842), polyethylene glycol derivatives (described in Japanese Patent Provisional Publication No. 62(1987)-151843), thiol (described in Japanese Patent Provisional Publication No. 62(1987)-151844), acetylene compounds (described in Japanese Patent Provisional Publication No. 62(1987)-87957) and sulfonamides (described in Japanese Patent Provisional Publication No. 62(1987)-178232).

An aromatic (a carbon or heterocyclic ring) mercapto compound (described in Japanese Patent Provisional Publication No. 6(1994)-313967) can also be used as an antifogging agent or a silver development accelerator. An aromatic heterocyclic mercapto compound, particularly a mercapto triazole derivative is preferred. The mercapto compound can be used in the form of a mercapto silver (silver salt).

These compounds are used in an amount of $10^{-7}$ to 1 mol based on 1 mol of the silver halide.

Known surface active agents can be added into the silver halide emulsion layer. Nonionic, anionic, cationic or fluoro surface active agents can be used. Japanese Patent Provisional Publication No 2(1990)-195356 describes these surface active agents. Sorbitans, polyoxyethylenes and fluorine-containing surface active agents are particularly preferred.

[Optionally provided layer]

A layer optionally provided in the silver halide light-sensitive material also preferably contains a hydrophilic polymer, more preferably gelatin, as a binder. The tanning developing agent can be added into the optional hydrophilic layer.

A back layer or an overcoating layer may be provided, and a matting agent can be added to the back layer or the overcoating layer to prevent adhesion between two light-sensitive materials when the materials are superposed.

Inorganic or organic solid particles dispersible in the hydrophilic polymer can be used as the matting agent.

Examples of the matting agents include oxides (e.g., silicon dioxide), alkaline earth metal salts, natural polymers (e.g., starch, cellulose) and synthetic polymers.

The average particle size of the matting agent is preferably in the range of 0.5 to 50 $\mu$m. The amount of the matting agent is preferably in the range of 0.1 to 1 g/m$^2$.

A protective layer may be provided on the silver halide emulsion layer, and the above-mentioned fine particles of oleophilic resin may be added into the protective layer. The protective layer containing the resin particles has a thickness of preferably 0.01 to 5 $\mu$m, more preferably 0.2 to 2 $\mu$m. Preferably, the protective layer contains some voids among the particles so that the developing agent can penetrate the layer.

The above-mentioned antifogging agent, silver development accelerator, stabilizer or surface active agent can be added into the optional layers.

Figure 5:
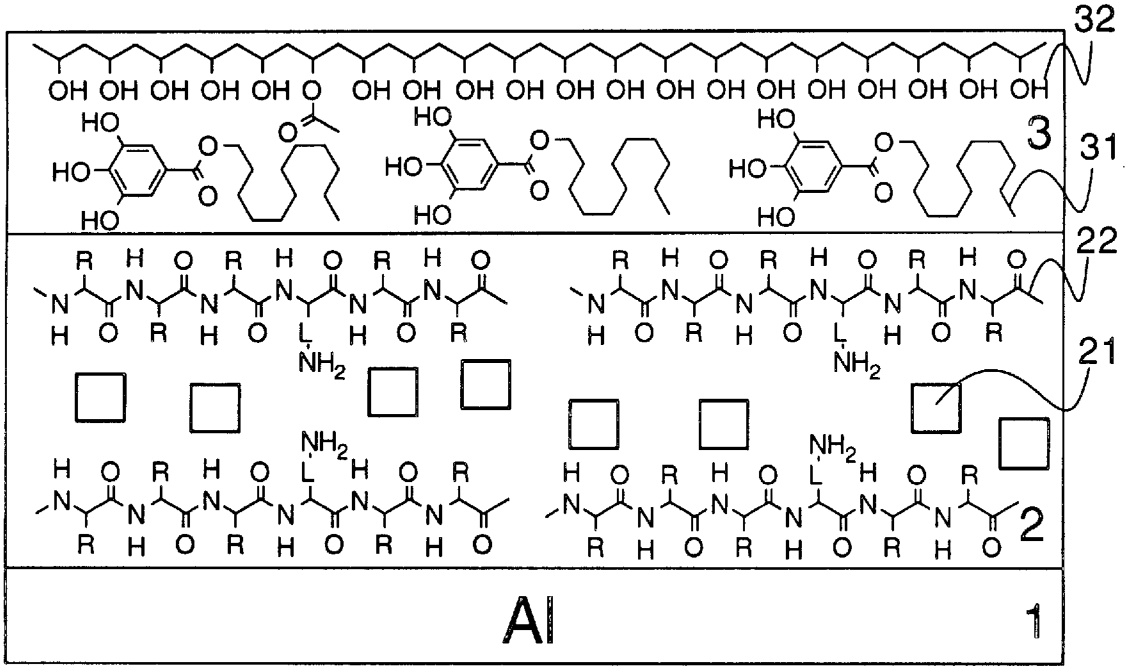
FIG. 5 is a sectional view schematically illustrating a silver halide light-sensitive material used in the present invention (according to the third embodiment).

FIG. 5 is a sectional view schematically illustrating a silver halide light-sensitive material used in the present invention (according to the third embodiment).

The silver halide light-sensitive material shown in FIG. 5 comprises a hydrophilic support (1) and a silver halide gelatin emulsion layer (2) and a hydrophilic layer (3) in this order. The silver halide gelatin emulsion layer (2) contains silver halide grains (21) and gelatin (22). The hydrophilic layer (3) contains a tanning developing agent (31) and a hydrophilic polymer (32).

[Exposing step]

The silver halide light-sensitive material is image-wise exposed to light.

The wavelength of the light corresponds to the spectral sensitivity of silver halide. The wavelength is usually within the visible, near ultraviolet or near infrared regions. A X-ray or an electron bean is also usable as the light.

Examples of the light sources include a tungsten lamp, a halogen lamp, a xenon lamp, a xenon flash lamp, a mercury lamp, a carbon arc lamp, various laser means (e.g., semiconductor laser, helium neon laser, argon ion laser, helium cadmium laser, YAG laser), light emitting diode and cathode-ray tube.

The amount of the exposure is usually in the range of 0.001 to 1,000 $\mu$J/cm$^2$, and preferably in the range of 0.01 to 100 $\mu$J/cm$^2$. The light-sensitive material can be exposed to light through the support if the support is transparent.

Figure 6:
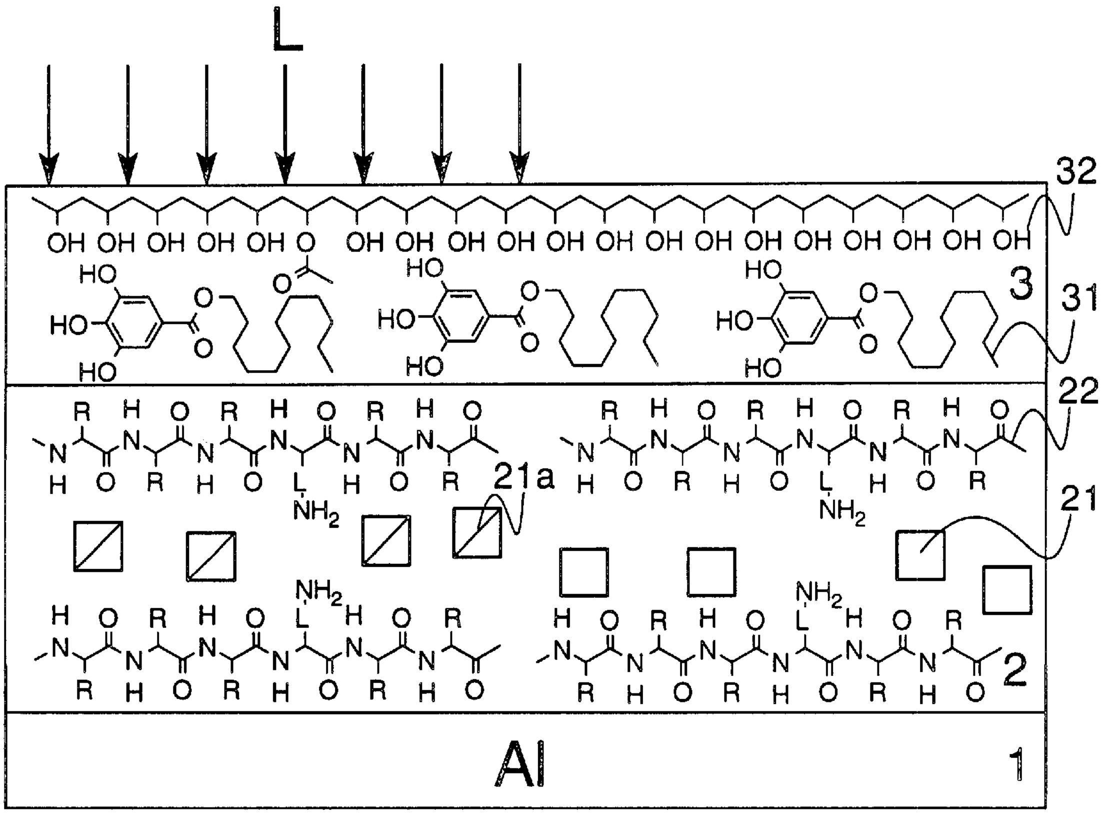
FIG. 6 is a sectional view schematically illustrating a step of imagewise exposing to light a silver halide light-sensitive material.

FIG. 6 is a sectional view schematically illustrating a step of imagewise exposing to light a silver halide light-sensitive material.

As is shown in FIG. 6, the silver halide light-sensitive material is exposed to light (L). A latent image of silver halide (21*a*) is formed in silver halide grains within the exposed are. On the other hand, the silver halide grains (21) are not changed within the unexposed area.

[Tanning developing step]

The silver halide light-sensitive material is subjected to tanning development with a developing solution, in which the tanning developing agent can be added.

The developing solution is generally alkali, and preferably has a PH value of not less than 9. Examples of alkali compounds usable for adjusting the pH include sodium hydroxide, potassium hydroxide, sodium phosphate, potassium phosphate, lithium phosphate, sodium carbonate, potassium carbonate, ammonium carbonate, sodium hydrogencarbonate and ammonia.

The solvent of the developing solution is preferably water, and if needed an organic solvent may be mixed with water.

The temperature of the solution is in the range of preferably 5 to 40° C., more preferably 20 to 35° C. The time for developing is in the range of preferably 10 seconds to 10 minutes, more preferably 20 seconds to 3 minutes.

The light-sensitive material may be treated with a liquid containing a mercapto compound after the development, to make the imaged area more oleophilic (in the manner described in Japanese Patent Provisional Publication No. 4(1992)-324866). Acid treatment or fixing treatment may be also performed.

Figure 7:
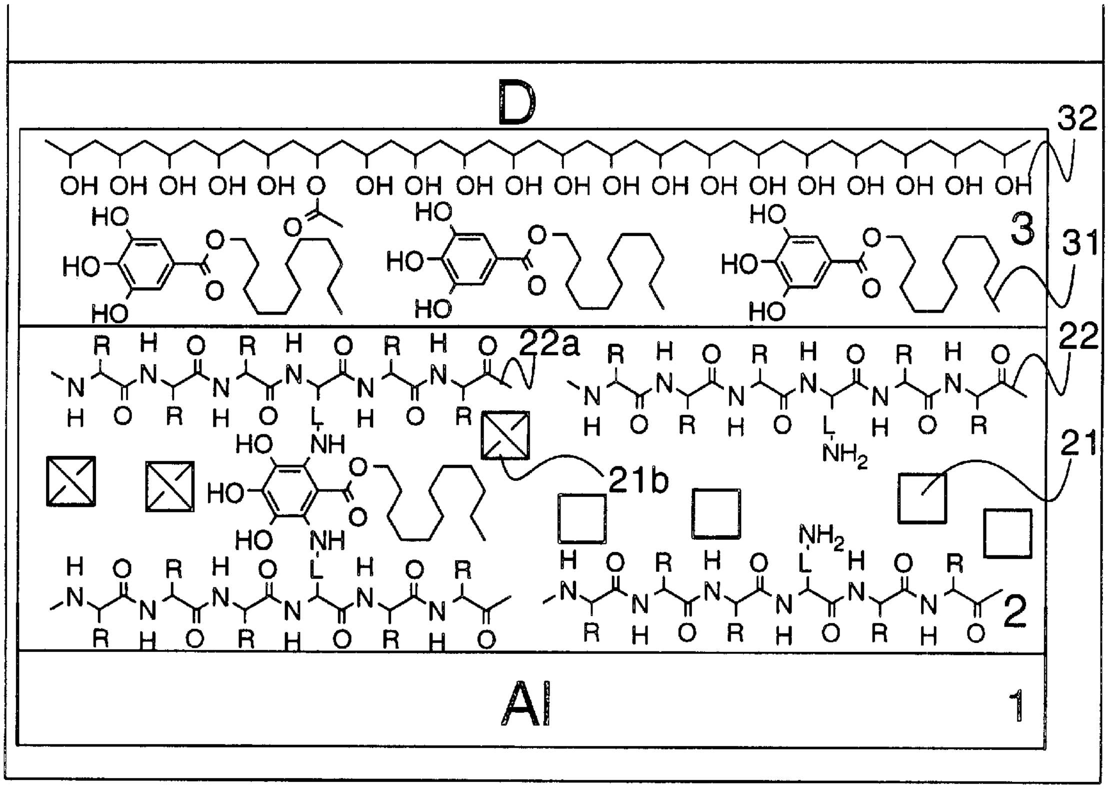
FIG. 7 is a sectional view schematically illustrating a step of tanning development.

FIG. 7 is a sectional view schematically illustrating a step of tanning development.

As is shown in FIG. 7, the exposed silver halide light-sensitive material is immersed in a tanning developing solution (D). The latent image of silver halide within the exposed area is developed to form a silver image (21*b*). The oxidation product of the tanning developing agent (quinone) is formed by the developing reaction. The oxidation product causes a cross-linking reaction of gelatin (22*a*) within the exposed area. On the other hand, gelatin (22) is not changed within the unexposed area.

[Removing step]

After the tanning development is completed, the silver halide light-sensitive material is immersed into a solvent (such as a hot water) and the surface is rubbed to remove unhardened gelatin in the unexposed area, and thereby a relief image made of hardened gelatin is formed. The temperature of the hot water is preferably in the range of 40 to 70° C. The surface can be rubbed with a sponge and brush.

The formed relief image is dried, and then used as a lithographic printing plate.

Post-treatments such as heating treatment, light-irradiating treatment and chemical treatment can be conducted.

Figure 8:
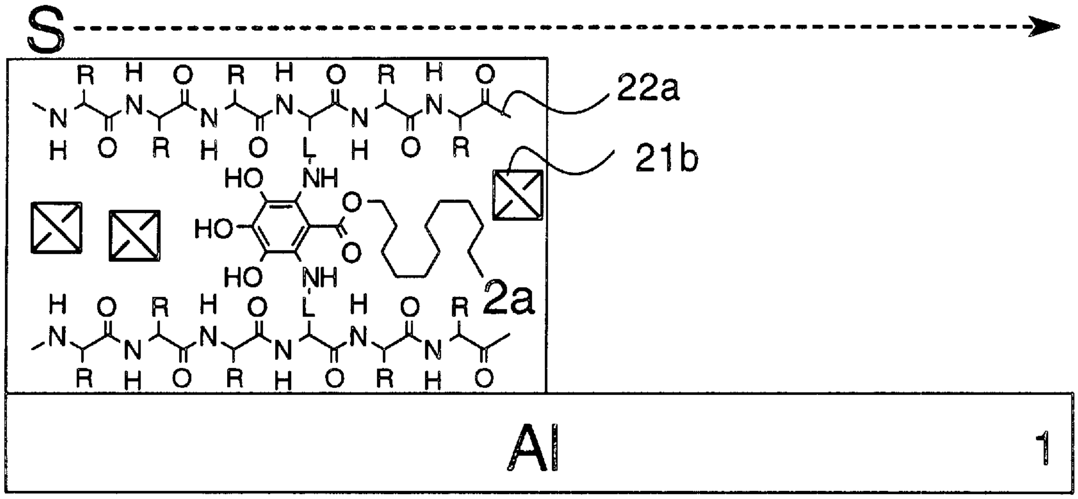
FIG. 8 is a sectional view schematically illustrating a step of removing unhardened gelatin.

FIG. 8 is a sectional view schematically illustrating a step of removing unhardened gelatin.

As is shown in FIG. 8, the developed silver halide is treated with a solvent (S). The hydrophilic layer and silver halide gelatin emulsion layer is dissolved in the solvent (S) and removed from the light-sensitive material. The silver halide gelatin emulsion layer within the exposed area (2*a*) remains on the hydrophilic support (1) to form a relief image, since the layer (2*a*) contains a cross-linked gelatin (22*a*). The relief image can be used as a litho-graphic printing plate.

The lithographic printing plate comprises a relief image of a hardened gelatin on a hydrophilic support. The gelatin is hardened by an oxidation product of a tanning developing agent.

EXAMPLE 1

[Preparation of aluminum support]

A surface of an aluminum plate (according to JIS-A-1050) having 0.24 mm thickness was ground with a nylon brush and an aqueous suspension of pumice stone of 400 mesh. The plate was well washed with water. The aluminum plate was then immersed for etching in 10 wt. % aqueous solution of sodium hydroxide at 70° C. for 60 seconds. The plate was washed with running water, neutralized with 20 wt. % aqueous solution of nitric acid, and washed with water. The obtained aluminum plate was subjected to an electrolytic surface-roughening treatment in 1 wt. % aqueous solution of nitric acid containing 0.5% aluminum nitrate in an anodically electric amount of 160 coulomb/dm$^2$ using pulse-wave alternating-corrugated current under such conditions as an anodic voltage of 12.7 V and a cathodically electric amount ratio to an anodically electric amount of 0.9. The center line average height (Ra) of the aluminum plate was 0.6 μm. The aluminum plate was immersed in 1 wt. % aqueous solution of sodium hydroxide at 40° C. for 30 seconds, and further immersed in 30 wt. % sulfuric acid at 55° C. for 1 minute. The plate was then subjected to anodizing treatment in 20 wt. % aqueous solution of sulfuric acid at a current density of 2 A/$dm^2$ to form an anodic oxide layer having the thickness of 2.5 g/$dm^2$. The plate was washed with water and dried to obtain an aluminum support.

The thus-prepared support was immersed in 2.5 wt. % aqueous solution (pH: 11.2) of sodium silicate No. 3 ($SiO_2$:28–30 wt. %, $Na_2O$: 9–10 wt. %, Fe: not more than 0.02 wt. %) at 70° C. for 13 seconds, and washed with water. The amount of silicate was measured by X-ray fluorometry to find 10 mg/$m^2$.

[Preparation of silver halide emulsion]

Gelatin, potassium bromide and water were placed in a vessel and heated to 55° C. With the temperature kept at 55° C., the following thioether compound ($2.0\times10^{-3}$ mol based on the total amount of silver nitrate) was added to the vessel. Further, an aqueous solution of silver nitrate and an aqueous solution of potassium bromide containing a rhodium ammonium chloride (the molar ratio of rhodium to the total amount of potassium iodide and silver nitrate was $4\times10^{-8}$ mol) were added to the vessel, according to a pAg controlled double jet method, with the pAg in the reaction vessel kept at 9.2 to prepare a silver iodobromide emulsion. To the emulsion, an aqueous solution of silver nitrate and a potassium bromide solution containing hexachloroiridate(III) salt (the molar ratio of iridium to silver was $1\times10^{-7}$ mol) was twice added to the emulsion at 55° C. and pAg 8.9 according to a double jet method to obtain a core/shell type silver iodobromide emulsion having the following composition.

(Thioether compound)

$HO—CH_2—CH_2—S—CH_2—CH_2—S—CH_2—CH_2—OH$

| | |
|---|---|
| Core: | Silver iodobromide |
| (silver iodide content: | 7.5 mol.%) |
| Shell: | Pure silver bromide |
| Core/shell: | 3/7 (molar ratio of silver) |
| Average silver iodide content: | 2.3 mol. % |
| Average grain size: | 0.28 μm |

The grains in the obtained emulsion were monodispersed. In the emulsion, 98% of the grains had a grain size within the range of the average grain size ±40%.

After the emulsion was desalted, a methanol solution of the following sensitizing dye A ($5\times10^{-3}$ M/litter) and a methanol solution of the following sensitizing dye B ($5\times10^{-3}$ M/litter) were added in amounts of both 100 ml per 1 mol of silver nitrate. The pH and the pAg were adjusted at 6.2 and 8.7, respectively. The emulsion was further subjected to gold-sulfur sensitization with sodium thiosulfate and chloroauric acid to prepare an aqueous emulsion of silver halide.

Solid content of the emulsion: 29.6 wt. %

Gelatin content of the emulsion: 3.5 wt. %

(Sensitizing dye A)

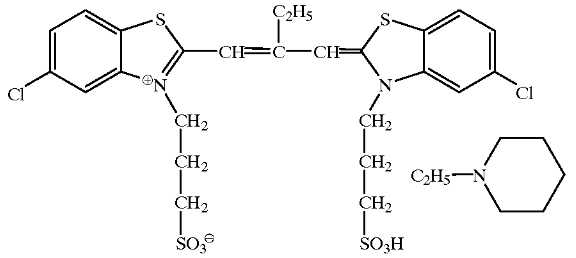

(Sensitizing dye B)

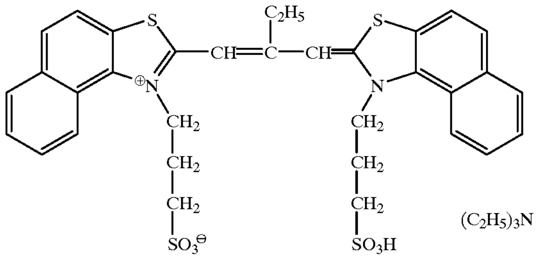

[Formation of silver halide gelatin emulsion layer]

The following coating solution was prepared, applied and dried on the aluminum support to form a silver halide gelatin emulsion layer having the dry thickness of 1.2 μm. Thus, a silver halide light-sensitive material was prepared.

| Coating solution for silver halide emulsion layer | |
|---|---|
| The above-prepared silver halide emulsion | 5 g |
| 10 Wt. % aqueous solution of gelatin | 25 g |
| 10 Wt. % methanol solution of the tanning developing agent (I-2) | 3.4 g |
| Water | 20 g |

[Preparation of tanning developing solution]

A tanning developing solution comprising the following components was prepared and used at 25° C.

| Tanning developing solution | |
|---|---|
| Metol | 3 g |
| Citric acid | 1 g |
| Potassium carbonate | 200 g |
| Potassium iodide | 1 g |
| Water | 1,000 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 μJ per $cm^2$.

The exposed material was immersed in the tanning developing solution for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity with the ink was observed. The imaged area (relief image) exhibited good affinity with the ink.

The printing plate was installed in an offset press (RYOBI 3200CCD, Ryobi Ltd.) and printing was performed to estimate the durability of the plate. The printing plate was durable enough to print 10,000 or more sheets.

EXAMPLES 2 TO 8

The procedure of Example 1 was repeated except that each of the tanning developing agents (I-6), (I-10), (I-14), (I-19), (I-22), (I-30) and (I-36) was used in the same amount in place of the agent (I-2), to prepare and evaluate a lithographic printing plate. The results are set forth in Table 1.

COMPARISON EXAMPLE 1

The procedure of Example 1 was repeated except that catechol was used in the same amount in place of the agent (I-2), to prepare and evaluate a lithographic printing plate. The results are set forth in Table 1.

TABLE 1

| Light-sensitive material | Tanning developing agent | Ink affinity | Durability |
|---|---|---|---|
| Example 1 | (I-2) | A | 10,000+ |
| Example 2 | (I-6) | A | 10,000+ |
| Example 3 | (I-10) | A | 10,000+ |
| Example 4 | (I-14) | A | 10,000+ |
| Example 5 | (I-19) | A | 10,000+ |
| Example 6 | (I-22) | A | 10,000+ |
| Example 7 | (I-30) | A | 10,000+ |
| Example 8 | (I-36) | A | 10,000+ |
| Comp. Ex. 1 | Catechol | B | 2,000 |

(Remarks)
A: Sufficient
B: Insufficient
10,000+: Durable enough after printing 10,000 or more sheets
2,000: Insufficient density after printing 2,000 sheets

EXAMPLE 9

[Formation of silver halide gelatin emulsion layer]

The following coating solution was prepared, applied and dried on the aluminum support used in Example 1, to form a silver halide gelatin emulsion layer having the dry thickness of 1.2 $\mu$m. Thus, a silver halide light-sensitive material was prepared.

| Coating solution for silver halide emulsion layer | |
|---|---|
| The silver halide emulsion used in Example 1 | 5 g |
| 10 Wt. % aqueous solution of gelatin | 25 g |
| Water | 20 g |

[Preparation of tanning developing solution]

Tanning developing solutions A and B comprising the following components were prepared. The solutions were mixed at 25° C. just before the development process.

| Tanning developing solution A | |
|---|---|
| The tanning developing agent (I-22) | 3 g |
| Metol | 3 g |
| Citric acid | 1 g |
| Water | 500 g |

| Tanning developing solution B | |
|---|---|
| Potassium carbonate | 200 g |
| Potassium iodide | 1 g |
| Water | 500 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 $\mu$J per $cm^2$.

The exposed material was immersed in the tanning developing solution for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 10,000 or more sheets.

EXAMPLES 10 TO 16

The procedure of Example 9 was repeated except that each of the tanning developing agents (I-7), (I-12), (I-18), (I-24), (I-31), (I-35) and (I-37) was used in the same amount in place of the agent (I-22), to prepare and evaluate a lithographic printing plate. The results are set forth in Table 2.

COMPARISON EXAMPLE 2

The procedure of Example 9 was repeated except that catechol was used in the same amount in place of the agent (I-22), to prepare and evaluate a lithographic printing plate. The results are set forth in Table 2.

TABLE 2

| Tanning developing solution | Tanning developing agent | Ink affinity | Durability |
|---|---|---|---|
| Example 9 | (1-22) | A | 10,000+ |
| Example 10 | (1-7) | A | 10,000+ |
| Example 11 | (1-12) | A | 10,000+ |
| Example 12 | (1-18) | A | 10,000+ |

TABLE 2-continued

| Tanning developing solution | Tanning developing agent | Ink affinity | Durability |
|---|---|---|---|
| Example 13 | (1-24) | A | 10,000+ |
| Example 14 | (1-31) | A | 10,000+ |
| Example 15 | (1-35) | A | 10,000+ |
| Example 16 | (1-37) | A | 10,000+ |
| Comp. Ex. 2 | Catechol | B | 2,500 |

(Remarks)
A: Sufficient
B: Insufficient
10,000+: Durable enough after printing 10,000 or more sheets
2,500: Insufficient density after printing 2,500 sheets

EXAMPLE 17

[Preparation of tanning developing agent dispersion]

The following composition (1) was mixed with the following composition (2) at 40° C., and the mixture was well stirred to prepare a tanning developing agent dispersion.

| Composition (1) | |
|---|---|
| The following copolymer (CP1) | 2.5 g |
| Tricresyl phosphate | 1.8 g |
| Ethyl acetate | 2.5 g |
| Water | 500 g |

(CP1)

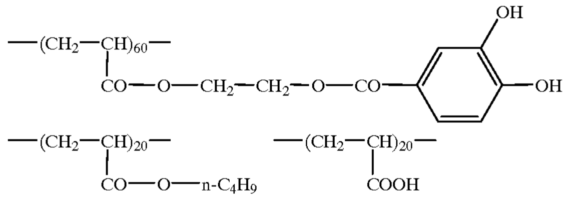

| Composition (2) | |
|---|---|
| Gelatin | 2.5 g |
| Water | 38 g |
| 6 Wt. % aqueous solution of saponin | 2.5 g |

[Formation of silver halide gelatin emulsion layer]

The following coating solution was prepared, applied and dried on the aluminum support used in Example 1 to form a silver halide gelatin emulsion layer having the dry thickness of 1.2 μm. Thus, a silver halide light-sensitive material was prepared.

| Coating solution for silver halide emulsion layer | |
|---|---|
| The silver halide emulsion used in Example 1 | 5 g |
| 10 Wt.% aqueous solution of gelatin | 25 g |
| The above-prepared tanning developing agent dispersion | 6 g |
| Water | 20 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump.

The light emission time was $10^{-4}$ second. The exposure (energy on the surface) was 2 μJ per $cm^2$.

The exposed material was immersed in the tanning developing solution used in Example 1 for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 10,000 or more sheets.

EXAMPLES 18 TO 24

The procedure of Example 17 was repeated except that each of the following copolymers (CP2), (CP3), (CP4), (CP5), (CP6), (CP7) and (CP8) was used in the same amount in place of the copolymer (CP1), to prepare and evaluate a lithographic printing plate. The results are set forth in Table 3.

(CP2)

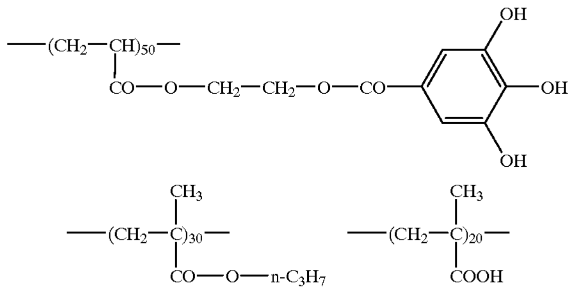

(CP3)

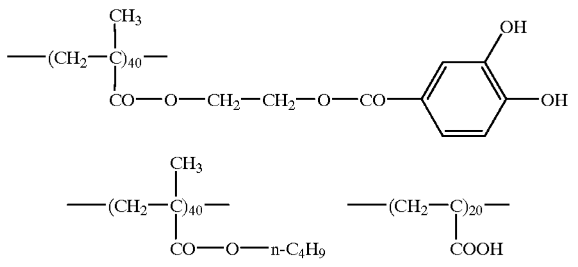

(CP4)

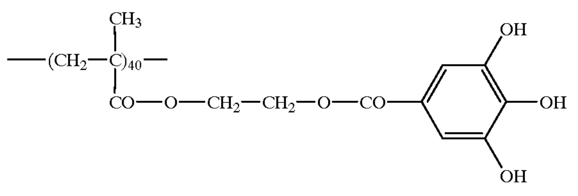

-continued

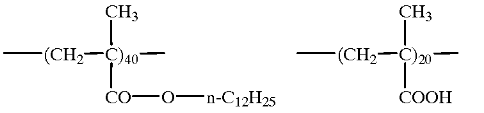

(CP5)

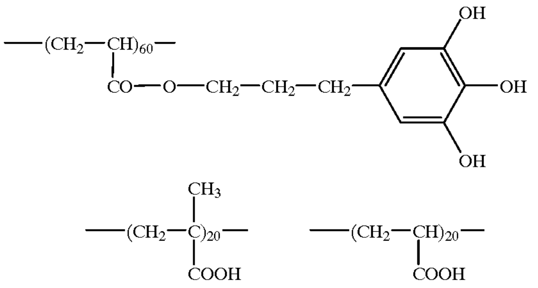

(CP6)

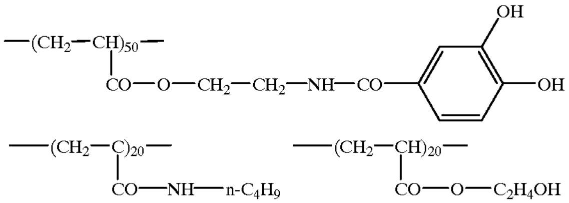

(CP7)

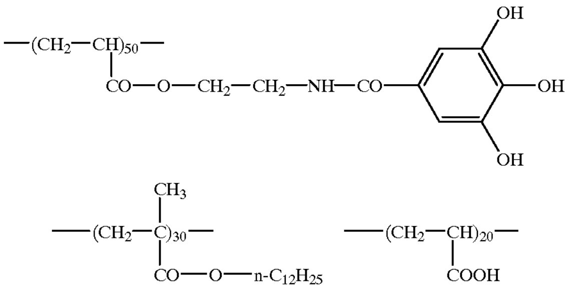

(CP8)

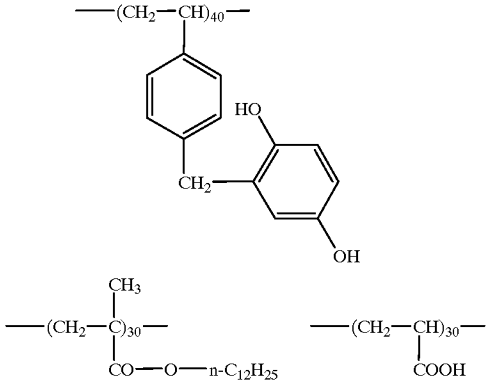

COMPARISON EXAMPLE 3

The procedure of Example 17 was repeated except that catechol was used in the same amount in place of the copolymer (CP1), to prepare and evaluate a lithographic printing plate. The results are set forth in Table 3.

TABLE 3

| Light-sensitive material | Tanning developing agent | Ink affinity | Durability |
|---|---|---|---|
| Example 17 | (CP1) | A | 10,000+ |
| Example 18 | (CP2) | A | 10,000+ |
| Example 19 | (CP3) | A | 10,000+ |
| Example 20 | (CP4) | A | 10,000+ |
| Example 21 | (CP5) | A | 10,000+ |
| Example 22 | (CP6) | A | 10,000+ |
| Example 23 | (CP7) | A | 10,000+ |
| Example 24 | (CP8) | A | 10,000+ |
| Comp. Ex. 3 | Catechol | B | 500 |

(Remarks)
A: Sufficient
B: Insufficient
10,000+: Durable enough after printing 10,000 or more sheets
500: Insufficient density after printing 2,500 sheets

EXAMPLE 25

[Preparation of tanning developing solution]

Tanning developing solutions A and B comprising the following components were prepared. The solutions were mixed at 25° C. just before the development process.

| Tanning developing solution A | |
|---|---|
| The following copolymer (CP9) | 3 g |
| Metol | 3 g |
| Citric acid | 1 g |
| Water | 500 g |

(CP9)

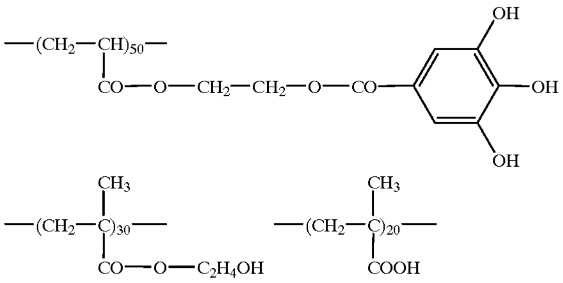

| Tanning developing solution B | |
|---|---|
| Potassium carbonate | 200 g |
| Potassium iodide | 1 g |
| Water | 500 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 $\mu$J per $cm^2$.

The exposed material was immersed in the tanning developing solution for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 10,000 or more sheets.

EXAMPLES 26 TO 32

The procedure of Example 25 was repeated except that each of the following copolymers (CP10), (CP11), (CP12), (CP13), (CP14), (CP15) and (CP16) was used in the same amount in place of the copolymer (CP9), to prepare and evaluate a lithographic printing plate. The results are set forth in Table 4.

(CP10)

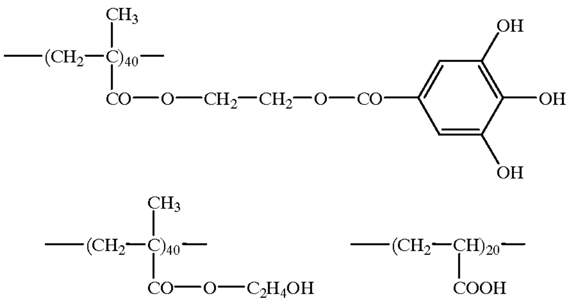

(CP11)

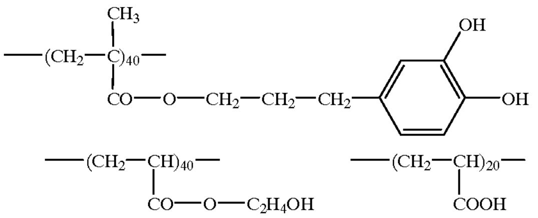

(CP12)

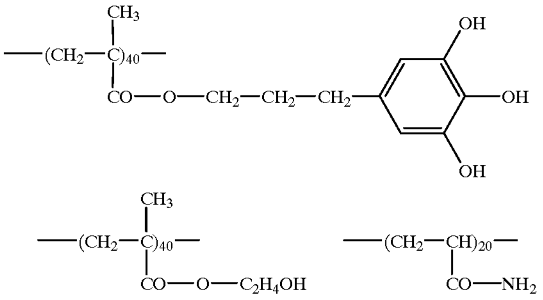

(CP13)

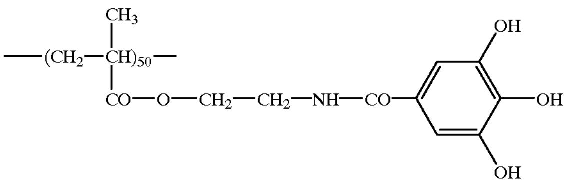

-continued

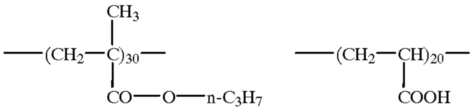

(CP14)

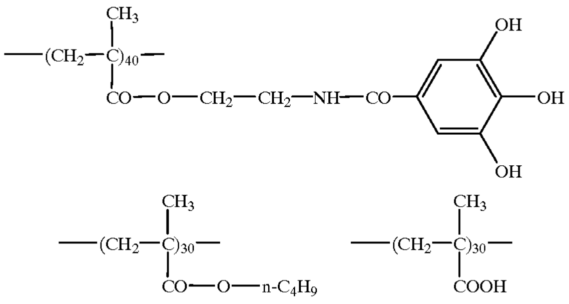

(CP15)

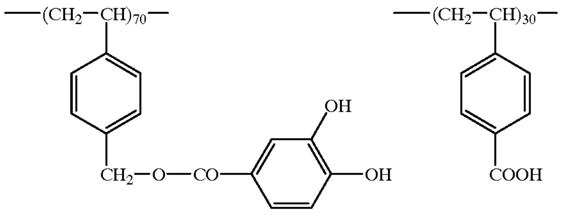

(CP16)

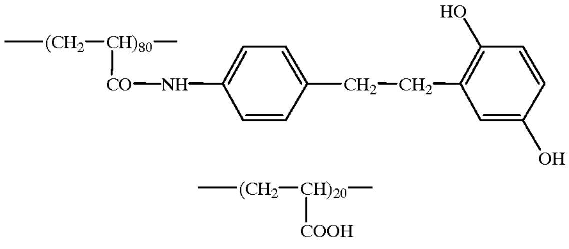

COMPARISON EXAMPLE 4

The procedure of Example 25 was repeated except that pyrogallol was used in the same amount in place of the copolymer (CP9), to prepare and evaluate a lithographic printing plate. The results are set forth in Table 4.

TABLE 4

| Tanning developing solution | Tanning developing agent | Ink affinity | Durability |
|---|---|---|---|
| Example 25 | (CP9) | A | 10,000+ |
| Example 26 | (CP10) | A | 10,000+ |
| Example 27 | (CP11) | A | 10,000+ |
| Example 28 | (CP12) | A | 10,000+ |
| Example 29 | (CP13) | A | 10,000+ |
| Example 30 | (CP14) | A | 10,000+ |
| Example 31 | (CP15) | A | 10,000+ |
| Example 32 | (CP16) | A | 10,000+ |
| Comp. Ex. 4 | Pyrogallol | B | 500 |

(Remarks)
A: Sufficient
B: Insufficient
10,000+: Durable enough after printing 10,000 or more sheets
500: Insufficient density after printing 500 sheets

EXAMPLE 33

[Formation of silver halide gelatin emulsion layer]

The following coating solution was prepared, applied and dried on the aluminum support used in Example 1 to form a silver halide gelatin emulsion layer having the dry thickness of 1.2 μm.

| Coating solution for silver halide emulsion layer | |
|---|---|
| The silver halide emulsion used in Example 1 | 5 g |
| 10 Wt. % aqueous solution of gelatin | 25 g |
| Water | 20 g |

[Formation of hydrophilic layer]

The following coating solution was prepared, applied and dried on the silver halide gelatin emulsion layer to form a hydrophilic layer having the dry thickness of 0.3 μm. Thus, a silver halide light-sensitive material was prepared.

| Coating solution for hydrophilic layer | |
|---|---|
| 10 Wt. % aqueous solution of polyvinyl alcohol (PVA-405, Kuraray Co., Ltd.) | 12.5 g |
| Methanol | 30 g |
| Water | 4 g |
| Tanning developing agent (II-2) | 0.6 g |

[Preparation of tanning developing solution]

Tanning developing solutions A and B comprising the following components were prepared. The solutions were mixed at 25° C. just before the development process.

| Tanning developing solution A | |
|---|---|
| Pyrogallol | 3 g |
| Metol | 3 g |
| Citric acid | 1 g |
| Water | 500 g |

| Tanning developing solution B | |
|---|---|
| Potassium carbonate | 200 g |
| Potassium iodide | 1 g |
| Water | 500 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 μJ per $cm^2$.

The exposed material was immersed in the tanning developing solution for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 10,000 or more sheets.

EXAMPLES 34 TO 42

The procedure of Example 33 was repeated except that each of the tanning developing agents (II-4), (II-5), (II-11), (II-20), (II-27), (II-43), (II-73), (II-92) and (II-115) was used in the same amount in place of the agent (II-2), to prepare and evaluate a lithographic printing plate. The results are set forth in Table 5.

COMPARISON EXAMPLE 5

The procedure of Example 33 was repeated except that the agent (II-2) was not used (wherein only pyrogallol in the tanning developing solution A functions as the tanning developing agent), to prepare and evaluate a lithographic printing plate. The results are set forth in Table 5.

TABLE 5

| Light-sensitive material | Agent in hydrophilic layer | Ink affinity | Durability |
|---|---|---|---|
| Example 33 | (II-2) | A | 10,000+ |
| Example 34 | (II-4) | A | 10,000+ |
| Example 35 | (II-50) | A | 10,000+ |
| Example 36 | (II-11) | A | 10,000+ |
| Example 37 | (II-20) | A | 10,000+ |
| Example 38 | (II-27) | A | 10,000+ |
| Example 39 | (II-43) | A | 10,000+ |
| Example 40 | (II-73) | A | 10,000+ |
| Example 41 | (II-92) | A | 10,000+ |
| Example 42 | (II-115) | A | 10,000+ |
| Comp. Ex. 5 | None | B | 50 |

(Remarks)
A: Sufficient
B: Insufficient
10,000+: Durable enough after printing 10,000 or more sheets
50: Insufficient density after printing 50 sheets

EXAMPLE 43

[Formation of silver halide gelatin emulsion layer]

The following coating solution was prepared, applied and dried on the aluminum support used in Example 1 to form a silver halide gelatin emulsion layer having the dry thickness of 1.2 μm. Thus, a silver halide light-sensitive material was prepared.

| Coating solution for silver halide emulsion layer | |
|---|---|
| The silver halide emulsion used in Example 1 | 5 g |
| 10 Wt.% aqueous solution of gelatin | 25 g |
| Water | 20 g |

[Preparation of tanning developing solution]

Tanning developing solutions C and D comprising the following components were prepared. The solutions were mixed at 25° C. just before the development process.

| Tanning developing solution C | |
|---|---|
| 5 Wt. % aqueous solution of the tanning developing agent (II-1) | 20 g |
| Pyrogallol | 3 g |
| Metol | 3 g |
| Citric acid | 1 g |
| Water | 500 g |

| Tanning developing solution D | |
|---|---|
| Potassium carbonate | 200 g |
| Potassium iodide | 1 g |
| Water | 500 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 $\mu$J per $cm^2$.

The exposed material was immersed in the tanning developing solution for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 10,000 or more sheets.

EXAMPLES 44 TO 50

The procedure of Example 43 was repeated except that each of the tanning developing agents (II-2), (II-19), (II-35), (II-49), (II-59), (II-68) and (II-124) was used in the same amount in place of the agent (II-1), to prepare and evaluate a lithographic printing plate. The results are set forth in Table 6.

COMPARISON EXAMPLE 6

The procedure of Example 43 was repeated except that the agent (II-1) was not used (wherein only pyrogallol in the tanning developing solution C functions as the tanning developing agent), to prepare and evaluate a lithographic printing plate. The results are set forth in Table 6.

TABLE 6

| Tanning developing solution | Tanning developing agent in developing solution | Ink affinity | Durability |
|---|---|---|---|
| Example 43 | Pyrogallol + (II-1) | A | 10,000+ |
| Example 44 | Pyrogallol + (II-2) | A | 10,000+ |
| Example 45 | Pyrogallol + (II-19) | A | 10,000+ |
| Example 46 | Pyrogallol + (II-35) | A | 10,000+ |
| Example 47 | Pyrogallol + (II-49) | A | 10,000+ |
| Example 43 | Pyrogallol + (II-59) | A | 10,000+ |
| Example 49 | Pyrogallol + (II-68) | A | 10,000+ |
| Example 50 | Pyrogallol + (II-124) | A | 10,000+ |
| Comp. Ex. 6 | Only pyrogallol | B | 500 |

(Remarks)
A: Sufficient
B: Insufficient
10,000+: Durable enough after printing 10,000 or more sheets
500: Insufficient density after printing 500 sheets

EXAMPLE 51

[Formation of silver halide gelatin emulsion layer]

The following coating solution was prepared, applied and dried on the aluminum support used in Example 1 to form a silver halide gelatin emulsion layer having the dry thickness of 1.5 $\mu$m. Thus, a silver halide light-sensitive material was prepared.

| Coating solution for silver halide emulsion layer | |
|---|---|
| The silver halide emulsion used in Example 1 | 5 g |
| 10 Wt. % aqueous solution of gelatin | 24 g |
| 20 Wt. % DMF solution of the tanning developing agent (I-11) | 2.3 g |
| 10 Wt. % methanol solution of the tanning developing agent (II-2) | 5.8 g |
| Metol | 0.14 g |
| 10 Wt. % aqueous solution of citric acid | 1 g |
| 1 Wt. % aqueous solution of the following additive A | 0.4 g |
| 0.5 Wt.% methanol solution of the following additive B | 1 g |
| Water | 34 g |

(Additive A)

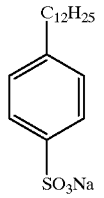

(Additive B)

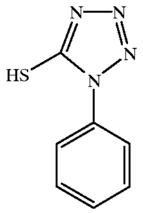

[Preparation of tanning developing solution]

A tanning developing solution comprising the following components was prepared.

| Tanning developing solution | |
|---|---|
| Potassium carbonate | 200 g |
| Potassium iodide | 1 g |
| Water | 1,000 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 $\mu$J per $cm^2$.

The exposed material was immersed in the tanning developing solution for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 15,000 or more sheets.

EXAMPLE 52

[Formation of silver halide gelatin emulsion layer]

The following coating solution was prepared, applied and dried on the aluminum support used in Example 1 to form a silver halide gelatin emulsion layer having the dry thickness of 1.5 $\mu$m.

| Coating solution for silver halide emulsion layer | |
|---|---|
| The silver halide emulsion used in Example 1 | 5 g |
| 10 Wt.% aqueous solution of gelatin | 24 g |
| 20 Wt.% DNF solution of the tanning developing agent (I-11) | 3.1 g |
| Metol | 0.14 g |
| 10 Wt. % aqueous solution of citric acid | 1 g |
| 1 Wt. % aqueous solution of the additive A used in Example 51 | 0.4 g |
| 0.5 Wt. % methanol solution of the additive B used in Example 51 | 1 g |
| Water | 34 g |

[Formation of hydrophilic layer]

The following coating solution was prepared, applied and dried on the silver halide gelatin emulsion layer to form a hydrophilic layer having the dry thickness of 0.3 $\mu$m. Thus, a silver halide light-sensitive material was prepared.

| Coating solution for hydrophilic layer | |
|---|---|
| 10 Wt. % aqueous solution of polyvinyl alcohol (PVA-405, Kuraray Co., Ltd.) | 12.5 g |
| 1 Wt. % aqueous solution of the additive A used in Example 51 | 0.7 g |
| Methanol | 30 g |
| Water | 4 g |
| Tanning developing agent (II-2) | 0.6 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 $\mu$J per $cm^2$.

The exposed material was immersed in the tanning developing solution used in Example 51 for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 15,000 or more sheets.

EXAMPLES 53 TO 57

The procedure of Example 52 was repeated except that each of the tanning developing agents set forth in Table 7 was used in the same amount in place of the agents (I-11) in the emulsion layer and (II-2) in the hydrophilic layer, to prepare and evaluate a lithographic printing plate. The results are set forth in Table 7.

TABLE 7

| Light-sensitive Material | Accent contained in Emulsion layer | Hydrophilic layer | Ink affinity | Durability |
|---|---|---|---|---|
| Example 52 | (I-11) | (11-2) | A | 15,000+ |
| Example 53 | (I-11) | (II-1) | A | 15,000+ |
| Example 54 | (I-8) | (II-90) | A | 15,000+ |
| Example 55 | (I-18) | (II-92) | A | 15,000+ |
| Example 56 | (I-23) | (II-42) | A | 15,000+ |
| Example 57 | (I-28) | (II-44) | A | 15,000+ |

(Remarks)
A: Sufficient
15,000+: Durable enough after printing 15,000 or more sheets

EXAMPLE 58

[Formation of silver halide gelatin emulsion layer]

The following coating solution was prepared, applied and dried on the aluminum support used in Example 1 to form a silver halide gelatin emulsion layer having the dry thickness of 1.2 $\mu$m.

| Coating solution for silver halide emulsion layer | |
|---|---|
| The silver halide emulsion used in Example 1 | 12 g |
| 10 Wt. % aqueous solution of gelatin | 40 g |
| 10 Wt. % aqueous solution of citric acid | 2.5 g |
| Metol | 0.3 g |
| 1 Wt. % aqueous solution of the additive A used in Example 51 | 0.3 g |
| 0.5 Wt. % methanol solution of the additive B used in Example 51 | 2 g |
| Water | 60 g |

[Formation of first hydrophilic layer]

The following coating solution was prepared, applied and dried on the silver halide gelatin emulsion layer to form a first hydrophilic layer having the dry thickness of 1.0 μm.

| Coating solution for first hydrophilic layer | |
|---|---|
| 10 Wt. % aqueous solution of gelatin | 50 g |
| 20 Wt. % DMF solution of the tanning developing agent (I-23) | 10 g |
| 10 Wt. % aqueous solution of citric acid | 1 g |
| 1 Wt. % aqueous solution of the additive A used in Example 51 | 1 g |
| Water | 50 g |

[Formation of second hydrophilic layer]

The following coating solution was prepared, applied and dried on the first hydrophilic layer to form a second hydrophilic layer having the dry thickness of 0.3 μm. Thus, a silver halide light-sensitive material was prepared.

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 μJ per $cm^2$.

The exposed material was immersed in the tanning developing solution used in Example 51 for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 15,000 or more sheets.

EXAMPLE 59

[Formation of first hydrophilic layer]

The following coating solution was prepared, applied and dried on the aluminum support used in Example 1 to form a first hydrophilic layer having the dry thickness of 1.0 μm.

| Coating solution for first hydrophilic layer | |
|---|---|
| 10 Wt. % aqueous solution of gelatin | 50 g |
| 20 Wt. % DMF solution of the tanning developing agent (I-19) | 10 g |
| 10 Wt. % aqueous solution of citric acid | 1 g |
| 1 Wt. % aqueous solution of the additive A used in Example 51 | 0.8 g |
| Water | 50 g |

[Formation of silver halide gelatin emulsion layer]

The following coating solution was prepared, applied and dried on the first hydrophilic layer to form a silver halide gelatin emulsion layer having the dry thickness of 1.2 μm.

| Coating solution for silver halide emulsion layer | |
|---|---|
| The silver halide emulsion used in Example 1 | 12 g |
| 10 Wt. % aqueous solution of gelatin | 40 g |
| 10 Wt. % aqueous solution of citric acid | 2.5 g |
| Metol | 0.3 g |
| 1 Wt. % aqueous solution of the additive A used in Example 51 | 1 g |
| 0.5 Wt. % methanol solution of the additive B used in Example 51 | 2 g |
| Water | 60 g |

[Formation of second hydrophilic layer]

The following coating solution was prepared, applied and dried on the silver halide gelatin emulsion layer to form a second hydrophilic layer having the dry thickness of 0.3 μm. Thus, a silver halide light-sensitive material was prepared.

| Coating solution for second hydrophilic layer | |
|---|---|
| 10 Wt. % aqueous solution of polyvinyl alcohol (PVA-405, Kuraray Co., Ltd.) | 12.5 g |
| 1 Wt. % aqueous solution of the additive A used in Example 51 | 0.7 g |
| Methanol | 30 g |
| Water | 4 g |
| Tanning developing agent (II-91) | 0.6 g |

(Image formation)

The silver halide light-sensitive material closely contacted with a control wedge (Fuji Photo Film Co., Ltd.) was imagewise exposed to light of 670 nm through a sharp cut interference filter. The light source was a xenon flush lump. The light emission time was $10^{-4}$ second. The exposure (energy on the surface) was 2 μJ per $cm^2$.

The exposed material was immersed in the tanning developing solution used in Example 51 for 30 seconds.

After the material was washed with running water at 45° C. for 15 seconds, the surface of the material was gently rubbed with a sponge to remove the silver halide emulsion layer in unexposed area. The material was then dried to form on the aluminum support a relief image having even thickness. The thus-formed relief image was used as a lithographic printing plate.

After the printing plate was wetted with water, PI ink (Fuji Photo Film Co., Ltd.) was applied on the plate and the affinity to the ink was observed. The imaged area (relief image) exhibited good affinity to the ink.

The printing plate was installed in an offset press (RYOBI 3200CCD, Ryobi Ltd.) and printing was performed to estimate the durability of the plate. The printing plate was durable enough to print 15,000 or more sheets.

What is claimed is:

1. A process for preparation of a lithographic printing plate comprising the steps in order of: imagewise exposing to light a silver halide light-sensitive material comprising a hydrophilic support and a silver halide gelatin emulsion layer, subjecting the silver halide light-sensitive material to tanning development to harden gelatin within an exposed area by using a tanning developing agent represented by the formula (I); and removing unhardened gelatin within an unexposed area from the silver halide gelatin emulsion layer to form a relief image of the hardened gelatin on the hydrophilic support;

(I)

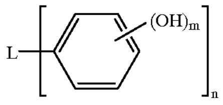

in which L is a n-valent linking group selected from the group consisting of a divalent to hexavalent aliphatic group, a divalent to hexavalent aromatic group, a divalent to hexavalent heterocyclic group, —O—, —S—, —CO— , —NH—, —N<, —$SO_2$—, —SO— and a combination thereof, wherein the aliphatic group, the aromatic group and the heterocyclic group may have a substituent group; the benzene ring may have a substituent group other than hydroxyl; m is 2 or 3; and n is an integer of 2 to 6.

2. The process as claimed in claim 1, wherein a phenol compound represented by the formula (II) is further used as the tanning developing agent:

(II)

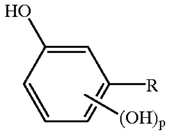

in which p is 1 or 2; and R is an aliphatic group having 5 to 40 carbon atoms, an aromatic group having 7 to 40 carbon atoms, an aliphatic acyl group having 5 to 40 carbon atoms, an aromatic acyl group having 7 to 40 carbon atoms, an aliphatic oxycarbonyl group having 5 to 40 carbon atoms, an aromatic oxycarbonyl group having 7 to 40 carbon atoms, an aliphatic acyloxy group having 5 to 40 carbon atoms, an aromatic acyloxy group having 7 to 40 carbon atoms, an aliphatic carbamoyl group having 5 to 40 carbon atoms or an aromatic carbamoyl group having 7 to 40 carbon atoms.

3. A silver halide light-sensitive material comprising a support and a silver halide gelatin emulsion layer, wherein the silver halide gelatin emulsion layer or an optionally provided hydrophilic layer contains a tanning developing agent having a molecular structure in which two to six benzenetriol rings are connected with a linking group.

4. The silver halide light-sensitive material as claimed in claim 3, wherein the linking group is selected from the group consisting of a divalent to hexavalent aliphatic group, a divalent to hexavalent aromatic group, a divalent to hexavalent heterocyclic group, —O—, —S—, —CO—, —NH—, —N<, —$SO_2$—, —SO— and a combination thereof.

5. The silver halide light-sensitive material as claimed in claim 3, wherein the tanning developing agent is represented by the formula (I):

(I)

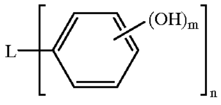

in which L is a n-valent linking group selected from the group consisting of a divalent to hexavalent aliphatic group, a divalent to hexavalent aromatic group, a divalent to hexavalent heterocyclic group, —O—, —S——CO—, —NH—, —N<, —$SO_2$—, —SO— and a combination thereof, wherein the aliphatic group, the aromatic group and the heterocyclic group may have a substituent group; the benzene ring may have a substituent group other than hydroxyl; and n is an integer of 2 to 6.

6. The silver halide light-sensitive material as claimed in claim 5, wherein L is in the formula (I) is an n-valent linking group comprising at least two groups selected from the group consisting of a divalent to tetravalent aliphatic group, a divalent to tetravalent aromatic group, a divalent to tetravalent heterocyclic group, —O—, —CO—, —NH—, —N< and —$SO_2$—, and n is an integer of 2 to 4.

7. The silver halide light-sensitive material as claimed in claim 3, wherein the silver halide helatin emulsion layer or the optionally provided hydrophilic layer further contains a phenol compound represented by the formula (II):

(II)

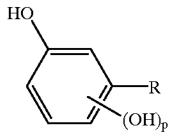

in which p is 1 or 2; and R is an aliphatic group having 5 to 40 carbon atoms, an aromatic group having 7 to 40 carbon atoms, an aliphatic acyl group having 5 to 40 carbon atoms, an aromatic group having 7 to 40 carbon atoms, an aliphatic oxycarbonyl group having 5 to 40 carbon atoms, an aromatic oxycarbonyl group having 7 to 40 carbon atoms, an aliphatic acyloxy group having 5 to 40 carbon atoms, an aromatic acyloxy group having 7 to 40 carbon atoms, an aliphatic carbamoyl group having 5 to 40 carbon atoms or an aromatic carbamoyl group having 7 to 40 carbon atoms.

8. A lithographic printing plate comprising a relief image of a hardened gelatin on a hydrophilic support, wherein the gelatin is hardened by an oxidation product of a tanning developing agent having a molecular structure in which two to six benzenetriol rings are connected with a linking group.

9. The lithographic printing plate as claimed in claim 8, wherein the gelatin is further hardened by an oxidation product of a phenol compound represented by the formula (II):

(II)

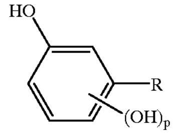

in which p is 1 or 2; and R is an aliphatic group having 5 to 40 carbon atoms, an aromatic group having 7 to 40 carbon atoms, an aliphatic acyl group having 5 to 40 carbon atoms, an aromatic group having 7 to 40 carbon atoms, an aliphatic oxycarbonyl group having 5 to 40 carbon atoms, an aromatic oxycarbonyl group having 7 to 40 carbon atoms, an aliphatic acyloxy group having 5 to 40 carbon atoms, an aromatic acyloxy group having 7 to 40 carbon atoms, an aliphatic carbamoyl group having 5 to 40 carbon atoms or an aromatic carbamoyl group having 7 to 40 carbon atoms.

* * * * *